US 7,880,203 B2

(12) United States Patent
Miyasaka et al.

(10) Patent No.: US 7,880,203 B2
(45) Date of Patent: Feb. 1, 2011

(54) SEMICONDUCTOR DEVICE, ELECTRO-OPTICAL DEVICE, ELECTRONIC APPARATUS, METHOD FOR MANUFACTURING SEMICONDUCTOR DEVICE, METHOD FOR MANUFACTURING ELECTRO-OPTICAL DEVICE, AND METHOD FOR MANUFACTURING ELECTRONIC APPARATUS

(75) Inventors: Mitsutoshi Miyasaka, Suwa (JP); Atsushi Miyazaki, Suwa (JP)

(73) Assignee: Seiko Epson Corporation (JP)

( * ) Notice: Subject to any disclaimer, the term of this patent is extended or adjusted under 35 U.S.C. 154(b) by 26 days.

(21) Appl. No.: 12/332,582

(22) Filed: Dec. 11, 2008

(65) Prior Publication Data
US 2009/0200609 A1    Aug. 13, 2009

(30) Foreign Application Priority Data
Feb. 8, 2008    (JP) .............................. 2008-028864

(51) Int. Cl.
*H01L 31/062* (2006.01)
(52) U.S. Cl. ............... 257/291; 257/443; 257/E29.273; 257/E51.005

(58) Field of Classification Search .................. 257/59, 257/72, 291, 443, E29.273, E51.005
See application file for complete search history.

(56) References Cited

U.S. PATENT DOCUMENTS 6,897,909 B2 * 5/2005 Ochiai et al. .................. 349/43
2008/0179597 A1 * 7/2008 Yamazaki et al. ............. 257/59

FOREIGN PATENT DOCUMENTS

| JP | 2002-323705 | 11/2002 |
|---|---|---|
| JP | 2004-109975 | 4/2004 |
| JP | 2006-245091 | 9/2006 |
| JP | 2006-261374 | 9/2006 |

* cited by examiner

*Primary Examiner*—Quoc D Hoang
(74) *Attorney, Agent, or Firm*—Harness, Dickey & Pierce, P.L.C.

(57) ABSTRACT

The invention provides, as an aspect thereof, a semiconductor device that includes: a substrate; an underlying insulation film that is formed over the substrate; and a plurality of thin-film transistors that is formed over the underlying insulation film, each of the plurality of thin-film transistors having a semiconductor film, wherein the underlying insulation film is formed in separate areas each of which includes, when viewed in plan, at least one of the plurality of semiconductor films.

21 Claims, 16 Drawing Sheets

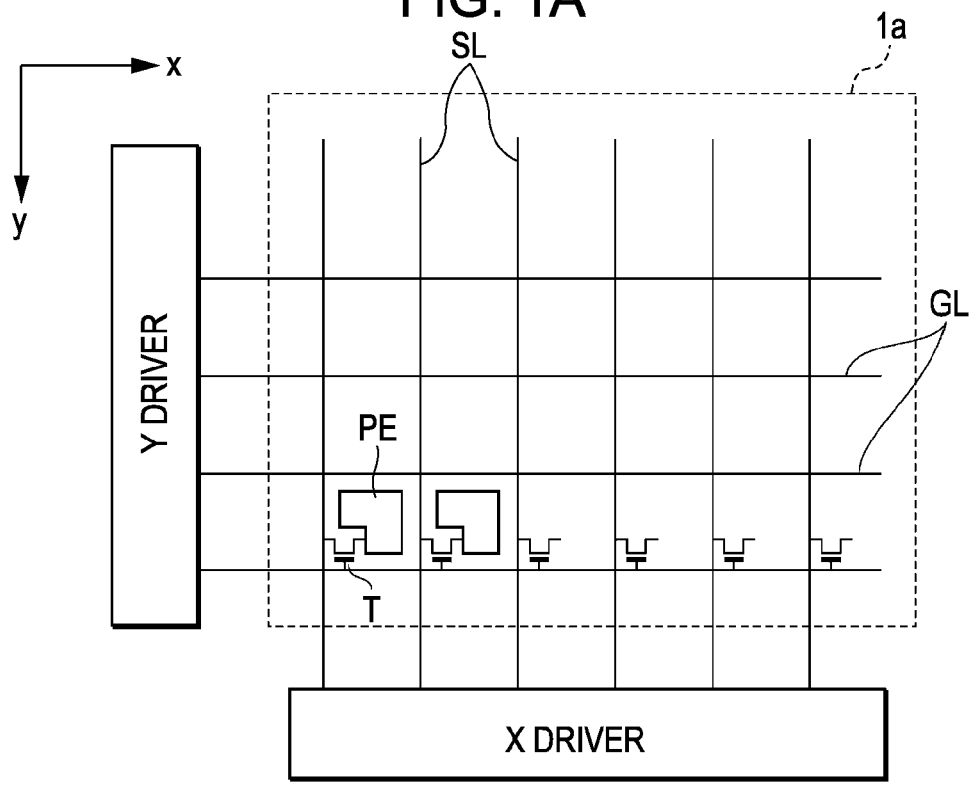
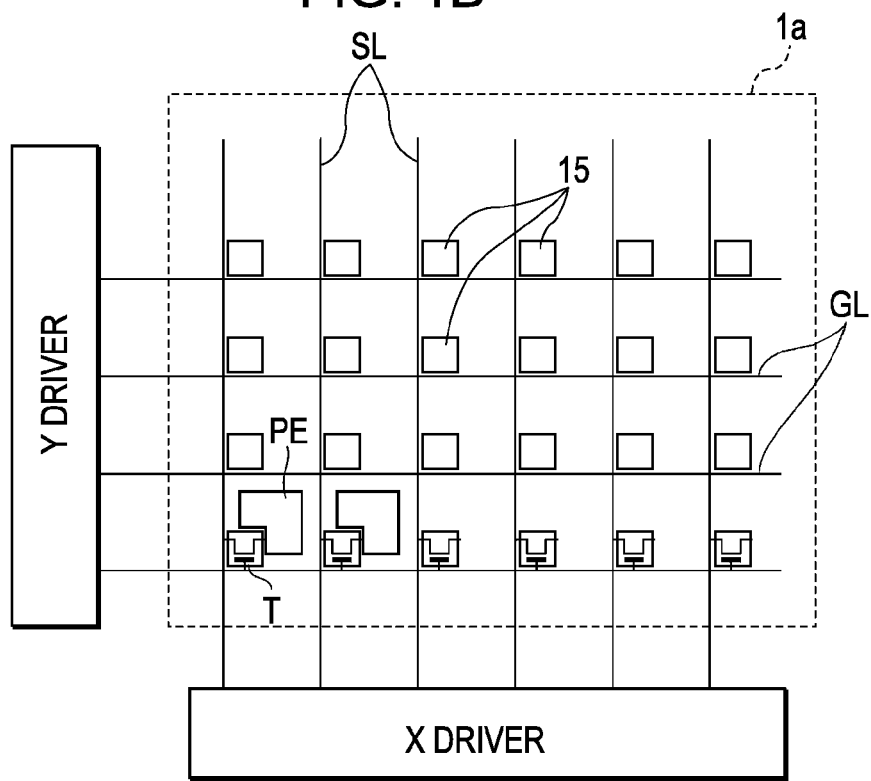

SEMICONDUCTOR DEVICE, ELECTRO-OPTICAL DEVICE, ELECTRONIC APPARATUS, METHOD FOR MANUFACTURING SEMICONDUCTOR DEVICE, METHOD FOR MANUFACTURING ELECTRO-OPTICAL DEVICE, AND METHOD FOR MANUFACTURING ELECTRONIC APPARATUS

BACKGROUND

1. Technical Field

The present invention generally relates to a semiconductor device. In particular, the invention relates to a semiconductor device that is formed over a flexible substrate, though not limited thereto.

2. Related Art

In recent research and development of various kinds of electro-optical devices such as a liquid crystal device and the like, the use of a flexible substrate as a component thereof has been studied. The flexible substrate has an advantage in that it is possible to make the size of an apparatus smaller. In addition, the flexible substrate achieves weight reduction. Moreover, the flexible substrate has another advantage in that it can offer flexibility as its name indicates while enhancing shock/impact resistance.

In the technical field to which the present invention pertains, for example, a technique for manufacturing a flexible TFT display device with the use of a metal foil as a substrate is described in JP-A-2004-109975. As another example of related art, a method for manufacturing an electro-optical device with the adoption of a transferring technique is described in JP-A-2006-245091. In addition, some applications of such a method for manufacturing an electro-optical device with the use of a transferring technique to a flexible display device is also described in the related-art technique of JP-A-2006-245091 mentioned herein.

The inventors of the present invention are engaged in the research and development of an electro-optical device that uses a flexible substrate as a component thereof with an aim to enhance the characteristics/performance of such a device.

For example, as a typical configuration of an active matrix substrate (hereafter may be referred to as an "array substrate") that is used as a component of such an electro-optical device, a plurality of pixels each of which has a thin-film transistor (TFT) and a pixel electrode is arrayed in a matrix layout. An inorganic insulation film such as a silicon oxide film or a silicon nitride film is formed over the entire surface of a glass substrate. The inorganic insulation film formed on the surface of the glass substrate functions as an underlying insulation film. After the deposition of the underlying insulation film on the glass substrate, various kinds of films are laminated over the underlying insulation film so as to form the thin-film transistors and the pixel electrodes mentioned above.

However, a layer structure that includes thin-film transistors and pixel electrodes formed over the underlying insulation film that is deposited on the entire surface of a flexible substrate has the following disadvantages. The flexibility of the flexible substrate differs from the flexibility of the underlying insulation film. Because of a difference in flexibility therebetween, the underlying insulation film and the thin-film transistor formed over the underlying insulation film may get cracked when either mechanical stress or thermal stress is applied thereto. If such a crack occurs, the characteristics of a device deteriorate.

SUMMARY

An advantage of some aspects of the invention is to provide the configuration of a semiconductor device inclusive of a thin-film transistor and an array substrate that offers improved reliability. In addition, the invention provides, as an advantage of some aspects thereof, a method for manufacturing such a semiconductor device.

In order to address the above-identified problem without any limitation thereto, the invention provides, as a first aspect thereof, a semiconductor device that includes: a substrate; an underlying insulation film that is formed over the substrate; and a plurality of thin-film transistors that is formed over the underlying insulation film, each of the plurality of thin-film transistors having a semiconductor film, wherein the underlying insulation film is formed in separate areas each of which includes, when viewed in plan, at least one of the plurality of semiconductor films. In the configuration of the semiconductor device according to the first aspect of the invention described above, it is preferable that each of the plurality of thin-film transistors should have the semiconductor film that is formed over the underlying insulation film and should further have a gate electrode that is formed over the semiconductor film with a gate insulation film being formed at a layer between the gate electrode and the semiconductor film; and the underlying insulation film should be formed in separate areas each of which includes, when viewed in plan, at least one of the plurality of semiconductor films.

In such a configuration, the underlying insulation film is not formed over the entire surface of the substrate but formed in separate areas each of which includes, when viewed in plan, at least one of the plurality of semiconductor films. Therefore, even when either mechanical stress or thermal stress is applied to a semiconductor device, stress is absorbed at separation areas at which the patterned underlying insulation films are not formed, thereby making it possible to prevent or at least substantially reduce the occurrence of cracks in the underlying insulation film. Thus, it is possible to prevent the thin-film transistor or its constituent films from getting broken or cracked, which results in improved transistor characteristics (i.e., reliability). Moreover, it is possible to improve the productivity of the device.

In the preferred configuration of the semiconductor device described above, it is further preferable that the underlying insulation film should be formed in separate areas corresponding to, when viewed in plan, the semiconductor films only. With such a preferred configuration, it is possible to decrease the formation area of the underlying insulation film. Thus, stress applied to the underlying insulation film is further reduced.

The semiconductor device having a preferred configuration described above should further include a plurality of gate lines that is formed at the same layer as the layer of the gate electrodes, each gate line connecting the gate electrodes arrayed adjacent to one another either in a first direction or a second direction, the second direction being orthogonal to the first direction, wherein the underlying insulation film is formed in separate areas as viewed in the first direction or the second direction, the separate areas corresponding to, when viewed in plan, the semiconductor films, the gate electrodes, and the gate lines only. With such a preferred configuration, it is possible to reduce stress applied in a direction that is orthogonal to a gate-line-extending direction, which is a direction in which each gate line extends.

In the configuration of the semiconductor device according to the first aspect of the invention described above, it is preferable that each of the plurality of thin-film transistors should have a gate electrode that is formed over the underlying insulation film and should further have the semiconductor film that is formed over the gate electrode with a gate insulation film being formed at a layer between the semiconductor film and the gate electrode; and the underlying insulation film should be formed in separate areas each of which includes, when viewed in plan, at least one of the plurality of semiconductor films and at least one of the plurality of gate electrodes.

With such a configuration, since the underlying insulation film is not formed over the entire surface of the substrate but formed in separate areas each of which includes, when viewed in plan, at least one of the plurality of semiconductor films and at least one of the plurality of gate electrodes, it is possible to prevent or at least substantially reduce the occurrence of cracks in the underlying insulation film. Thus, it is possible to prevent the thin-film transistor or its constituent films from getting broken or cracked, which results in improved transistor characteristics. Moreover, it is possible to improve the productivity of the device.

The semiconductor device having a preferred configuration described above should further include electro-conductive films that are formed at the same layer as the layer of the gate electrodes, wherein the underlying insulation film is formed in separate areas corresponding to, when viewed in plan, the gate electrodes, the semiconductor films, and the electro-conductive films only. As described above, the underlying insulation film may be formed in separate areas corresponding to, when viewed in plan, not only the gate electrodes and the semiconductor films but also the electro-conductive films that are formed at the same layer as the layer of the gate electrodes.

The semiconductor device having a preferred configuration described above should further include a plurality of gate lines that is formed at the same layer as the layer of the gate electrodes, each gate line connecting the gate electrodes arrayed adjacent to one another either in a first direction or a second direction, the second direction being orthogonal to the first direction, wherein the underlying insulation film is formed in separate areas as viewed in the first direction or the second direction, the separate areas corresponding to, when viewed in plan, the semiconductor films, the gate electrodes, and the gate lines only. With such a preferred configuration, it is possible to reduce stress applied in a direction that is orthogonal to a gate-line-extending direction, which is a direction in which each gate line extends.

In the configuration of the semiconductor device according to the first aspect of the invention described above, the substrate may be a flexible substrate. Even in a case where a flexible substrate is used as the substrate mentioned above, it is possible to reduce stress applied to the underlying insulation film.

In order to address the above-identified problem without any limitation thereto, the invention provides, as a second aspect thereof, an electro-optical device that is provided with the semiconductor device according to the first aspect of the invention described above. An electro-optical device having such a configuration achieves and features improved characteristics.

In order to address the above-identified problem without any limitation thereto, the invention provides, as a third aspect thereof, an electronic apparatus that is provided with the semiconductor device according to the first aspect of the invention described above or the electro-optical device according to the second aspect of the invention described above. An electronic apparatus having such a configuration achieves and features improved characteristics.

In order to address the above-identified problem without any limitation thereto, the invention provides, as a fourth aspect thereof, a method for manufacturing a semiconductor device, including: forming, over a first substrate, a layered film structure that is made up of a underlying insulation film and a semiconductor film that is deposited on the underlying insulation film, the layered film structure being formed in an array layout; and forming a gate electrode over the layered film structure that has been formed in the array layout with a gate insulation film being formed at a layer between the gate electrode and the layered film structure.

With such a method, since the underlying insulation film is not formed over the entire surface of the substrate but formed in separate areas in an arrayed manner, it is possible to prevent or at least substantially reduce the occurrence of cracks in the underlying insulation film. Thus, it is possible to prevent the thin-film transistor or its constituent films from getting broken or cracked, which results in improved transistor characteristics. Moreover, it is possible to improve the productivity of the device.

In the method for manufacturing a semiconductor device according to the fourth aspect of the invention described above, it is preferable that the layered film structure should be formed as a result of the patterning of the underlying insulation film and the semiconductor film in the same single patterning process. With such a preferred method, it is possible to simplify the process of manufacturing a semiconductor device.

It is preferable that the method for manufacturing a semiconductor device according to the fourth aspect of the invention described above should further include: transferring the layered film structure that is made up of the underlying insulation film and the semiconductor film deposited on the underlying insulation film, the gate insulation film, and the gate electrode onto a second substrate as a temporary transfer after the formation of the layered film structure, the gate insulation film, and the gate electrode over the first substrate; removing the first substrate from the layered film structure, the gate insulation film, and the gate electrode after the temporary transfer; transferring the layered film structure, the gate insulation film, and the gate electrode, which have been temporarily transferred onto the second substrate, onto a third substrate as a non-temporary transfer; and removing the second substrate from the layered film structure, the gate insulation film, and the gate electrode after the non-temporary transfer. With such a preferred method, it is possible to easily transfer various kinds of films formed over the first substrate onto the third substrate. In such a preferred method, since the underlying insulation film that has not been formed over the entire surface of the first substrate but has been formed in separate areas in an arrayed manner is transferred onto the third substrate, it is possible to prevent or at least substantially reduce the occurrence of cracks in the underlying insulation film even after the transfer. Thus, it is possible to prevent the thin-film transistor or its constituent films from getting broken or cracked, which results in improved transistor characteristics.

In order to address the above-identified problem without any limitation thereto, the invention provides, as a fifth aspect thereof, a method for manufacturing a semiconductor device, including: forming a plurality of underlying insulation films over a first substrate, each of the plurality of underlying insulation films extending in a first direction; forming, over each of the plurality of underlying insulation films, a plurality of gate electrodes and a gate line, each of the plurality of gate lines being formed at the same layer as the layer of the plurality of gate electrodes, each of the plurality of gate lines connecting the gate electrodes arrayed adjacent to one another in a first direction; and forming a plurality of semiconductor films, each of the plurality of semiconductor films being formed over the corresponding one of the plurality of gate electrodes with a gate insulation film being formed at a layer between the semiconductor film and the gate electrode.

In such a method, the underlying insulation films are formed over the first substrate separately from one another. Each of the plurality of underlying insulation films extends in the first direction. Therefore, with such a method, it is possible to reduce stress that is applied to the underlying insulation film in the second direction that is orthogonal to the first direction. Moreover, it is possible to improve the productivity of the device.

It is preferable that the method for manufacturing a semiconductor device according to the fifth aspect of the invention described above should further include: transferring the underlying insulation film, the gate electrode, the gate line, the gate insulation film, and the semiconductor film that have been formed over the first substrate onto a second substrate as a temporary transfer; removing the first substrate from the underlying insulation film, the gate electrode, the gate line, the gate insulation film, and the semiconductor film after the temporary transfer; transferring the underlying insulation film, the gate electrode, the gate line, the gate insulation film, and the semiconductor film, which have been temporarily transferred onto the second substrate, onto a third substrate as a non-temporary transfer; and removing the second substrate from the underlying insulation film, the gate electrode, the gate line, the gate insulation film, and the semiconductor film after the non-temporary transfer. With such a preferred method, it is possible to easily transfer various kinds of films formed over the first substrate onto the third substrate. In such a preferred method, the underlying insulation films that have been formed over the first substrate separately from one another in such a manner that each of the plurality of underlying insulation films extends in the first direction are transferred onto the third substrate. Therefore, with such a preferred method, it is possible to reduce stress that is applied to the underlying insulation films in the second direction that is orthogonal to the first direction even after the transfer.

In the method for manufacturing a semiconductor device according to the fourth aspect of the invention described above, the first substrate may be a flexible substrate. In addition, the third substrate may be a flexible substrate. Even in a case where a flexible substrate is used as each of the first substrate and the third substrate mentioned above, or even in a case where a flexible substrate is used either as the first substrate or the third substrate mentioned above, it is possible to reduce stress applied to the underlying insulation film.

In order to address the above-identified problem without any limitation thereto, the invention provides, as a sixth aspect thereof, a method for manufacturing an electro-optical device that includes the method for manufacturing a semiconductor device according to the fourth aspect of the invention described above. With such a manufacturing method, it is possible to produce an electro-optical device having excellent characteristics. Moreover, it is possible to improve the productivity of the electro-optical device.

In order to address the above-identified problem without any limitation thereto, the invention provides, as a seventh aspect thereof, a method for manufacturing an electronic apparatus that includes the method for manufacturing a semiconductor device according to the fourth aspect of the invention described above or the method for manufacturing an electro-optical device according to the sixth aspect of the invention described above. With such a manufacturing method, it is possible to produce an electronic apparatus having excellent characteristics. Moreover, it is possible to improve the productivity of the electronic apparatus.

BRIEF DESCRIPTION OF THE DRAWINGS

The invention will be described with reference to the accompanying drawings, wherein like numbers reference like elements.

FIGS. 1A and 1B is a set of circuit diagrams that schematically illustrates an example of the configuration of an array substrate according to a first exemplary embodiment of the invention.

FIG. 2A is a sectional view that schematically illustrates an example of a method for manufacturing an array substrate according to the first exemplary embodiment of the invention; whereas

FIG. 3A is a sectional view that schematically illustrates an example of a method for manufacturing an array substrate according to the first exemplary embodiment of the invention; whereas

FIG. 4A is a sectional view that schematically illustrates an example of a method for manufacturing an array substrate according to the first exemplary embodiment of the invention; whereas

FIG. 5A is a sectional view that schematically illustrates an example of a method for manufacturing an array substrate according to the first exemplary embodiment of the invention; whereas

FIG. 6A is a sectional view that schematically illustrates an example of a method for manufacturing an array substrate according to the first exemplary embodiment of the invention; whereas

FIG. 12A is a sectional view that schematically illustrates an example of a method for manufacturing an array substrate according to the second exemplary embodiment of the invention; whereas

FIG. 13A is a sectional view that schematically illustrates an example of a method for manufacturing an array substrate according to the second exemplary embodiment of the invention; whereas

FIG. 15A is a sectional view that schematically illustrates an example of a method for manufacturing an array substrate according to the second exemplary embodiment of the invention; whereas

FIG. 16A is a sectional view that schematically illustrates an example of a method for manufacturing an array substrate according to the second exemplary embodiment of the invention; whereas

FIG. 17A is a sectional view that schematically illustrates an example of a method for manufacturing an array substrate according to the second exemplary embodiment of the invention; whereas

DESCRIPTION OF EXEMPLARY EMBODIMENTS

Figure 2A:
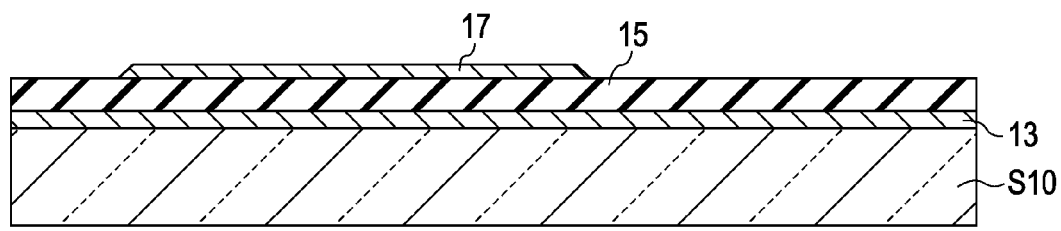

With reference to the accompanying drawings, exemplary embodiments of the present invention are explained in detail below. In the following description of exemplary embodiments of the invention, the same reference numerals are consistently used for components that have the same function as one another, or corresponding reference numerals are assigned thereto, so as to omit any redundant explanation thereof. In the following description of this specification as well as in the recitation of appended claims, the term "a plurality of films" has a very broad meaning. In addition to its customary meaning, it encompasses the meaning of film portions that are formed, for example, in the same single film deposition process and then patterned into plural areas, without any limitation thereto.

Embodiment 1

Configuration of Array Substrate

FIGS. 1A and 1B is a set of circuit diagrams that schematically illustrates an example of the configuration of an array substrate according to an exemplary embodiment of the invention. As shown in FIG. 1A, an array substrate according to the present embodiment of the invention has a plurality of source lines SL and a plurality of gate lines GL. The source lines SL are arrayed adjacent to one another in an image display area 1a. Each of the plurality of source lines SL extends in the "y" direction. The gate lines GL are also arrayed adjacent to one another in the image display area 1a. Each of the plurality of gate lines GL extends in the "x" direction. A plurality of pixels is arrayed in a matrix pattern in the image display area 1a. Each of the plurality of pixels is formed at a position corresponding to the intersection of the source line SL and the gate line GL. Each of the plurality of pixels is provided with a pixel electrode PE and a thin-film transistor T. In such an x-y line layout of an array substrate, for example, an X driver drives each of the plurality of source lines SL, whereas a Y driver drives each of the plurality of gate lines GL.

In this paragraph, the features of an array substrate according to the present embodiment of the invention are briefly summarized without any intention to excessively limit the technical scope of the invention. Note that more detailed features of an array substrate according to the present embodiment of the invention are explained in the following paragraphs of DESCRIPTION OF EXEMPLARY EMBODIMENTS as well as in the accompanying drawings. As illustrated in FIG. 1B, the underlying insulation film 15 is patterned in a plurality of island areas over a flexible substrate. That is, these island areas are separated from one another when viewed in plan. An individual island underlying insulation film 15, which means one individual island area portion of the underlying insulation film 15 in this sentence, is formed under each individual island-patterned semiconductor film, which means one individual island area portion of the semiconductor film in this sentence. Each individual island-patterned semiconductor film constitutes a part of the corresponding one of a plurality of thin-film transistors T. If the substrate is made of metal, the island underlying insulation films 15 may be formed not only under the semiconductor films but also under the plurality of gate lines GL. Moreover, the island underlying insulation films 15 may be formed under the plurality of source lines SL in addition to the plurality of gate lines GL. The underlying insulation film 15 that has been deposited over the substrate is removed at any area other than the above-mentioned island areas, that is, under each island-patterned semiconductor film. If the island underlying insulation films 15 are formed not only under the semiconductor films but also under the plurality of gate lines GL (and the plurality of source lines SL), the underlying insulation film 15 is removed at any area other than these "semiconductor-and-line" areas. In other words, in the layer/layout configuration of an array substrate according to the present embodiment of the invention, the underlying insulation film 15 is patterned into island areas that are isolated from one another. The active part of a transistor, a semiconductor film that has a region functioning as an electrode of a hold capacitor, and a metal line if necessary, are formed over each island-patterned underlying insulation film 15. The underlying insulation film 15 has the following four main functions. 1. The underlying insulation film 15 ensures the improved adhesion of a semiconductor film, a metal film, and the like and a flexible substrate. 2. The underlying insulation film 15 makes it possible to prevent any contaminant from being dispersed from a flexible substrate or a glass substrate onto a semiconductor film during a TFT manufacturing process. 3. If the substrate is made of metal, the underlying insulation film 15 ensures insulation between elements, lines, and the like, that is, electric disconnection therebetween. 4. If the substrate is made of metal, semiconductor, or the like, the underlying insulation film 15 reduces a substrate capacitance, which is a parasitic capacitance between lines and the substrate. The advantageous effects of both of the prevention of contaminant dispersion (2) and the reduction of a substrate capacitance (4) become more remarkable as the thickness of the underlying insulation film 15 increases. In addition, both of the improvement in the adhesion of a semiconductor film and a flexible substrate (1) and the electric insulation between elements, lines, and the like (3) increase in their reliability as the thickness of the underlying insulation film 15 increases. As explained above, generally speaking, it is preferable to increase the thickness of an underlying insulation film so as to ensure the reliable performance of a thin-film electronic device. However, a flexible electronic device/element that is formed over a flexible substrate becomes more susceptible to damage due to a crack and the like as the thickness of an underlying insulation film increases. That is, from the viewpoint of stress-resistance reliability, it is preferable to form the underlying insulation film as a thin film, which conflicts with the requirement mentioned above. The present invention has been made in order to provide a technical solution to such conflicting requirements, which constitutes a non-limiting problem to be addressed by the invention. In an exemplary configuration of the present invention, an underlying insulation film is not formed over the entire surface of a substrate but formed at necessary areas only. In addition, the underlying insulation film is patterned in plurality of island areas that are isolated from one another. In the configuration of an array substrate according to one exemplary embodiment of the invention, the underlying insulation film is patterned in plurality of island areas that are isolated from one another in such a manner that each individual island underlying insulation film is formed under the corresponding one of island-patterned semiconductor films. With such a layout/layer structure, even when thermal stress or mechanical stress is applied to a flexible electronic device, the stress is distributed among the plurality of island-patterned underlying insulation films. Thus, it is possible to prevent the underlying insulation film, which is made of a stress-vulnerable inorganic substance such as silicon oxide, silicon nitride, or the like, from getting broken. Therefore, an electronic device according to an exemplary embodiment of the invention is strong against external stress, which improves device reliability and extends service life remarkably. Moreover, in the configuration of an array substrate according to one exemplary embodiment of the invention, it is possible to ensure a sufficient thickness of each island-patterned underlying insulation film with a significant increase therein from 200 nm to 700 nm. Consequently, even when a low-temperature polysilicon TFT (LTPS-TFT), which is manufactured under a temperature condition ranging from 200° C. to 600° C., is used as a thin-film transistor, it is possible to prevent, without failure, any contaminant from being dispersed from a substrate onto a semiconductor film during a TFT manufacturing process. Thus, it is possible to manufacture a thin-film transistor that has excellent electric characteristics. Moreover, it is possible to ensure excellent adhesion of a semiconductor film and a metal line. Furthermore, it is possible to ensure excellent element insulation. If the flexible substrate is made of metal, it is possible to significantly decrease a substrate capacitance because a thick underlying insulation film is formed under each island-patterned semiconductor film and each metal line. Thus, it is possible to form a semiconductor circuit that can be operated in a high speed over the flexible substrate. As some examples of the material of a flexible substrate, plastic, metal, fiber, or paper can be used without any limitation thereto.

Process of Manufacturing Array Substrate

Figure 7:
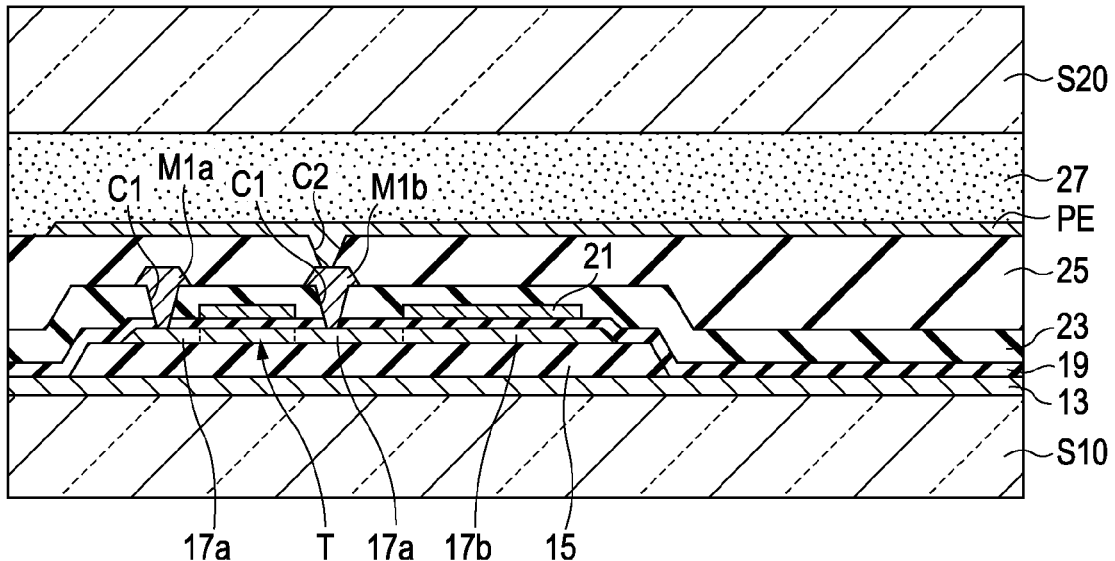
FIG. 7 is a sectional view that schematically illustrates an example of a process for transferring a formed array structure according to the first exemplary embodiment of the invention.
Figure 8:
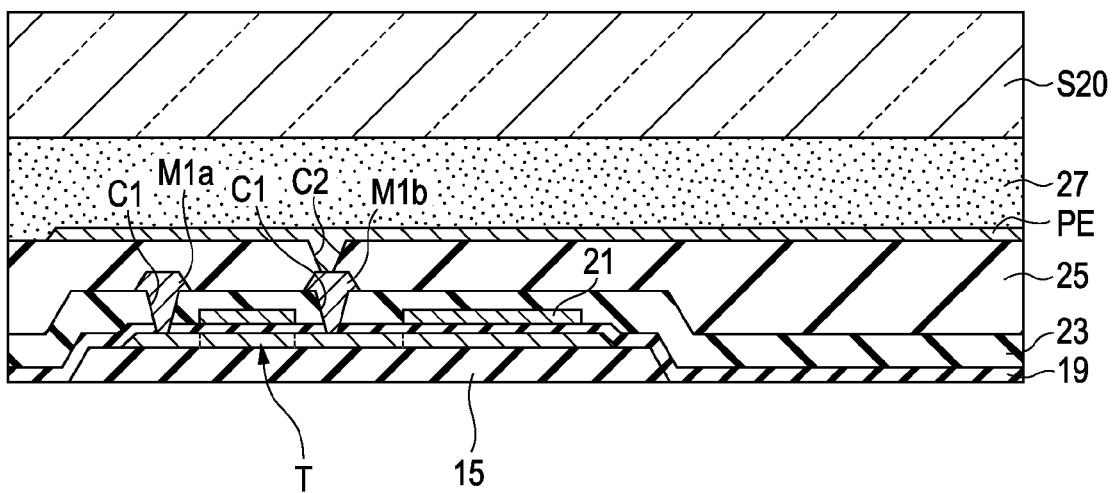
FIG. 8 is a sectional view that schematically illustrates an example of a process for transferring a formed array structure according to the first exemplary embodiment of the invention.
Figure 9:
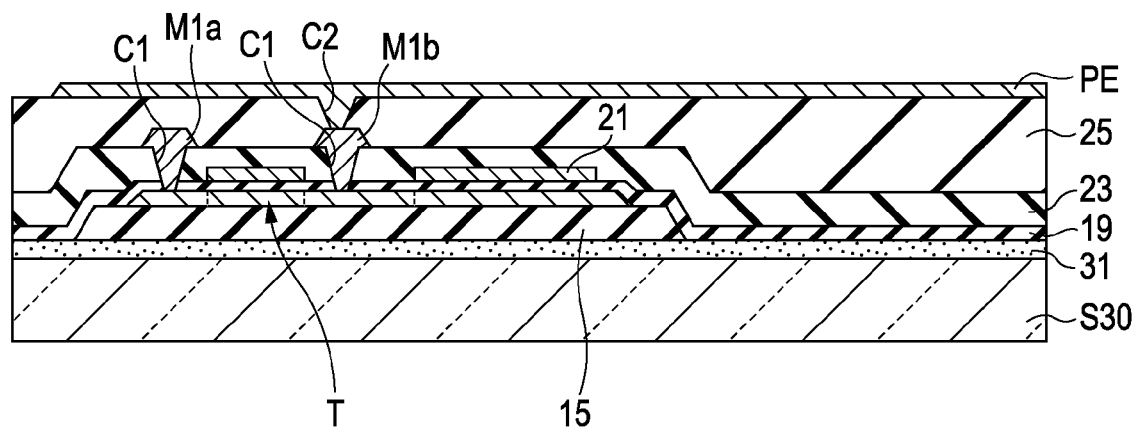
FIG. 9 is a sectional view that schematically illustrates an example of a process for transferring a formed array structure according to the first exemplary embodiment of the invention.

In the following description, a method for manufacturing an array substrate according to the present embodiment of the invention is explained, including the formation of thin-film transistors and pixel electrodes. In addition to its manufacturing method, the configuration of an array substrate according to the present embodiment of the invention is also explained below. Each of FIGS. 2A/2B, 3A/3B, 4A/4B, 5A/5B, and 6A/6B is a set of a sectional view and a plan view corresponding to each other that schematically illustrates an example of a method for manufacturing an array substrate according to the present embodiment of the invention. Each of FIGS. 7, 8, and 9 is a sectional view that schematically illustrates an example of a process for transferring a formed array structure according to the present embodiment of the invention. Each of the plan views 2B, 3B, 4B, 5B, and 6B shows the essential array pattern of one pixel viewed in two dimensions in an array-substrate manufacturing process. Each of the sectional views 2A, 3A, 4A, 5A, and 6A shows a cross section taken along the line IIA-IIA, IIIA-IIIA, IVA-IVA, VA-VA, VIA-VIA of the corresponding one of the plan views 2B, 3B, 4B, 5B, and 6B.

A first substrate S10 is prepared as shown in FIG. 2A. The first substrate S10 is made of a transparent substance such as glass without any limitation thereto. A first-substrate removing layer 13, which is used later for detaching the first substrate S10 from the formed layer structure, is deposited on the entire surface of the first substrate S10. The first-substrate removing layer 13 is made of, for example, an amorphous silicon film. The amorphous silicon layer 13 can be formed thereon by means of, for example, a chemical vapor deposition (CVD) method. A ceramic material may be used for the formation of the first-substrate removing layer 13.

Next, a silicon oxide film, without any limitation thereto, is deposited on the entire surface of the first-substrate removing layer 13 by means of a CVD method or the like. The silicon oxide film functions as an underlying insulation film 15, that is, a ground insulator film. The thickness of the underlying insulation film 15 is approximately 300-500 nm. Other inorganic insulation film such as a silicon nitride film or the like may be used in place of the silicon oxide film.

Figure 2B:
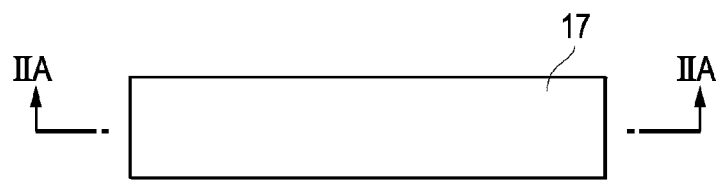
FIG. 2B is a corresponding plan view that schematically illustrates an example of a method for manufacturing an array substrate according to the first exemplary embodiment of the invention.

Next, a semiconductor film 17, which is to be patterned into an island shape, is formed on the entire surface of the underlying insulation film 15. For example, an amorphous silicon film and a polycrystalline silicon film are used for the formation of the semiconductor film 17. The semiconductor film 17 has a thickness of, for example, 25-100 nm. The amorphous silicon film is deposited over the underlying insulation film 15 by a CVD method, a sputtering method, or the like. The polycrystalline silicon film is formed as a result of the crystallization of the amorphous silicon film that has been deposited as explained above. A solid-phase crystallization method or a laser irradiation method is used for the crystallization thereof. Next, the semiconductor film 17 is patterned into a desired form. Herein, as shown in FIG. 2B, the semiconductor film 17 is patterned into a substantially rectangular shape. Specifically, a photo-resist film, which is not shown in the drawing, is formed on the semiconductor film 17. Then, the photo-resist film is subjected to light-exposure treatment and development treatment (i.e., photo lithography) so that the photo-resist film has a desired form, which is herein a substantially rectangular shape. Next, the semiconductor film 17 is subjected to etching while using the photo-resist film as a mask. As a result thereof, the remaining photo-resist film is removed. A series of steps from the formation of the photo-resist film to the removal thereof explained above is called as a patterning process.

As has already been explained above, since the plan view of FIG. 2B shows an area corresponding to only one pixel, only one semiconductor film 17 is shown therein. However, since the plurality of pixels is arrayed in a matrix pattern, the plurality of the rectangular-patterned semiconductor films 17 is also arrayed in a matrix pattern.

Figure 3A:
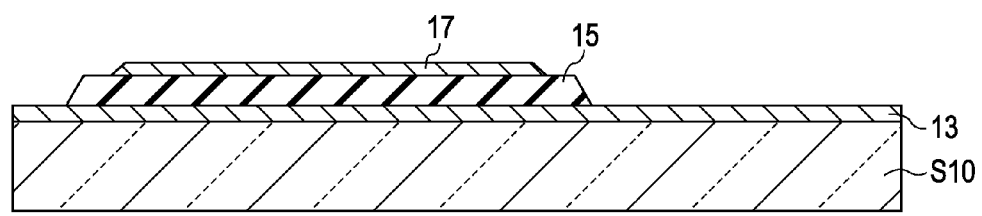
Figure 3B:
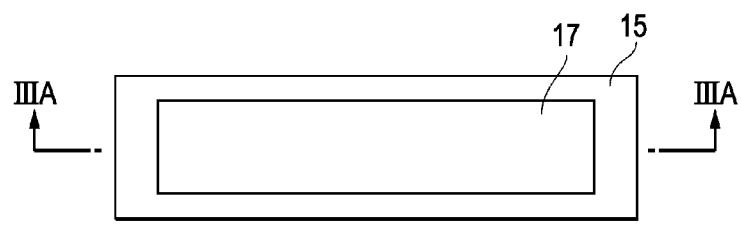
FIG. 3B is a corresponding plan view that schematically illustrates an example of a method for manufacturing an array substrate according to the first exemplary embodiment of the invention.

Next, as shown in FIGS. 3A and 3B, the underlying insulation film 15 is patterned into a substantially rectangular shape. The rectangular-patterned underlying insulation film 15 is a size larger than the rectangular-patterned semiconductor film 17. In the foregoing description, it is explained that the semiconductor film 17 and the underlying insulation film 15 are patterned in two separate processes. Notwithstanding the foregoing, however, the semiconductor film 17 and the underlying insulation film 15 may be patterned in a single non-separate process while using the photo-resist film as a mask. If the semiconductor film 17 and the underlying insulation film 15 are patterned in a single non-separate process, the patterned size/shape of the semiconductor film 17 is substantially the same as that of the underlying insulation film 15.

In a case where, in addition to the rectangular areas explained above, a part of the underlying insulation film 15 is formed under circuit lines, the underlying insulation film 15 should be patterned so that the above-mentioned part of the underlying insulation film 15 remains without being removed under these lines. In a typical layer structure of a top-gate thin film transistor (TFT), an inter-bedded insulation film, which insulates one layer from the other as an inter-layer insulation film, is formed over a gate line. In addition, in such a typical layer structure of a top-gate TFT, a source line is formed over the inter-bedded insulation film. Therefore, the inter-bedded insulation film functions also as an underlying insulation film for the source line. For this reason, the underlying insulation film may be patterned so that the non-removed part thereof is formed under the gate line and the semiconductor film. As will be explained in detail later, however, a gate insulation film functions also as an underlying insulation film under the gate line. In view of the foregoing, it is explained in the present embodiment of the invention that a layered film structure made up of the rectangular-patterned semiconductor films 17 and the rectangular-patterned underlying insulation films 15 are formed in an arrayed manner. The two-step patterning process described above according to which a semiconductor film is patterned first, followed by the patterning of an underlying insulation film, has the following advantages, though not necessarily limited thereto. As one advantage thereof, alignment is easier when a substrate is transparent. As another advantage thereof, when the semiconductor film is deposited by means of a CVD method or a sputtering method, it is possible to prevent any foreign particle, dust, or the like (hereafter referred to as "substrate impurities") from being dispersed from the substrate into a CVD chamber or a sputtering chamber. This means that it is possible to avoid a CVD/sputter manufacturing apparatus from becoming contaminated with the substrate impurities. Needless to say, the patterning may be performed in the reverse order. That is, an underlying insulation film may be patterned into islands first, followed by the deposition of a semiconductor film thereon. The deposited film may be subjected to crystallization. Thereafter, the semiconductor film is patterned into islands.

Figure 4A:
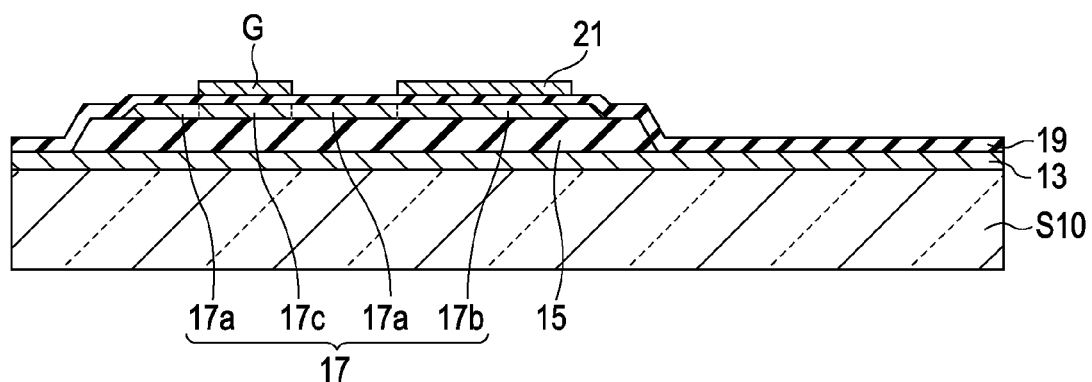

Next, a photo-resist film is formed on a channel region 17c of the semiconductor film 17. The channel region 17c corresponds to an area at which, when viewed in plan, a gate electrode is to be formed in a subsequent layer formation process. Then, n-type or p-type impurities are implanted into the semiconductor film 17 while using the photo-resist film as a mask so as to form a source region 17a and a drain region 17a as shown in FIG. 4A. Note that the same reference numeral 17a is assigned herein for each of the source region and the drain region. In the exemplary manufacturing process shown in FIG. 4A, the impurities are implanted not only at the above-mentioned regions but also at a remote end region as viewed from the channel region so as to form a first electrode 17b of a hold capacitor (i.e., retention volume) thereat.

Next, the photo-resist film is removed. Then, for example, a silicon oxide film is deposited as a gate insulation film 19 over the entire surface of the first substrate S10 including an area over the semiconductor film 17 by means of a CVD method. The thickness of the gate insulation film 19 is, for example, approximately 75 nm. Thereafter, a metal film such as an aluminum (Al) film or the like is deposited on the gate insulation film 19 as an electro-conductive film by means of a sputtering method, which is followed by the patterning thereof. A gate electrode G is formed as a result of the deposition of the electro-conductive film on the gate insulation film 19 and the patterning thereof.

Figure 4B:
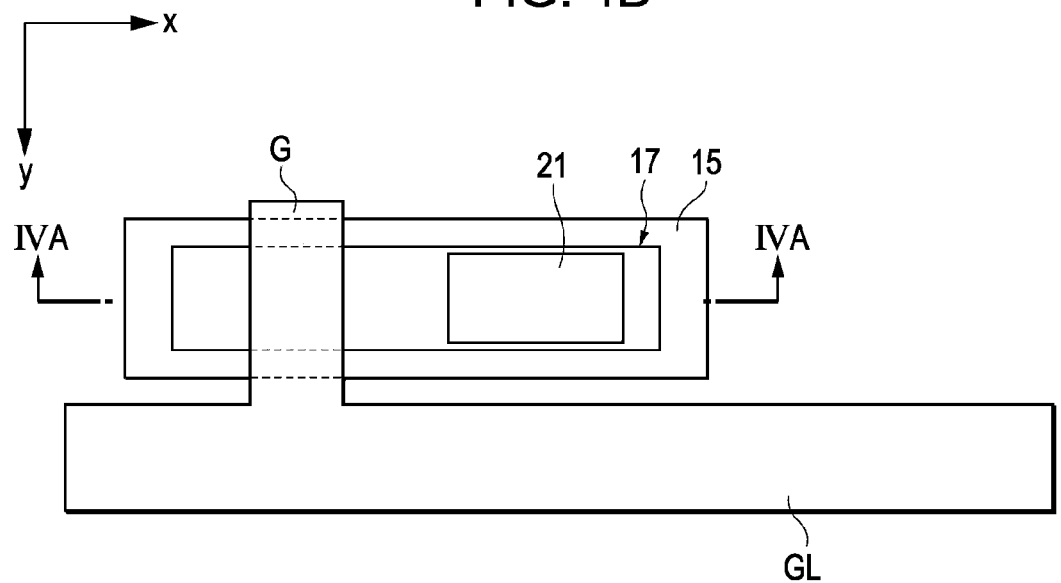
FIG. 4B is a corresponding plan view that schematically illustrates an example of a method for manufacturing an array substrate according to the first exemplary embodiment of the invention.

Through a series of layer formation steps explained above, a top-gate thin film transistor T that is provided with the source region (i.e., source electrode) 17a, the drain electrode 17a, the channel region 17c, the gate insulation film 19, and the gate electrode G is formed. In addition, the gate line GL, which is connected to the gate electrode G, as well as a second electrode 21 of the aforementioned hold capacitor is formed during the patterning process explained above as illustrated in FIG. 4B. As has already been explained earlier, pixels are arrayed in a matrix layout. Each of the plurality of gate lines GL extends in the x direction so as to provide a gate electric connection to the gate electrode G of the TFT of each one of a row of pixels aligned in the x direction. Although the underlying insulation film 15 is not formed under the gate line GL in a layer structure according to the present embodiment of the invention, the gate insulation film 19 plays the role of and thus functions as a ground insulator film in place of the underlying insulation film 15. Note that the first electrode 17b, the gate insulation film 19, and the second electrode 21 make up the aforementioned hold capacitor.

Figure 5A:
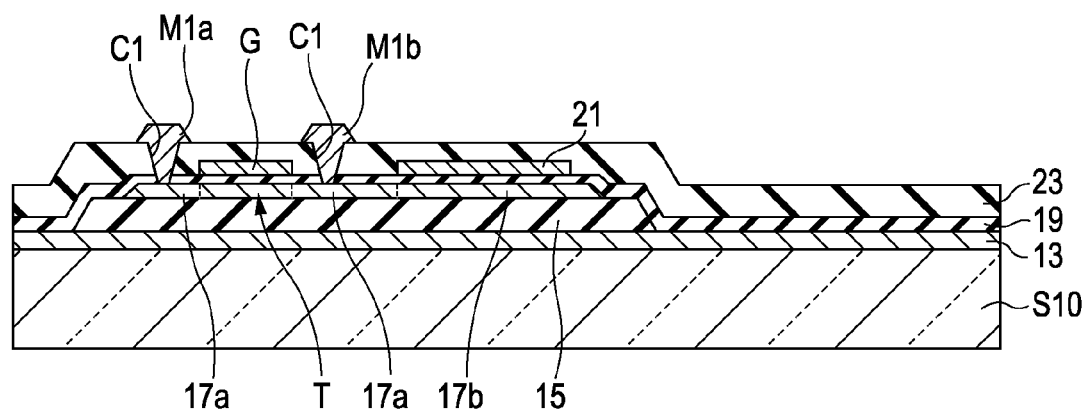

Next, as illustrated in FIG. 5A, an inter-bedded insulation film 23 is formed on the gate electrode G, the gate line GL, and the second electrode 21 by means of a CVD method. The inter-bedded insulation film 23 is made of, for example, silicon oxide. The thickness of the inter-bedded insulation film 23 is approximately 500-800 nm.

Figure 5B:
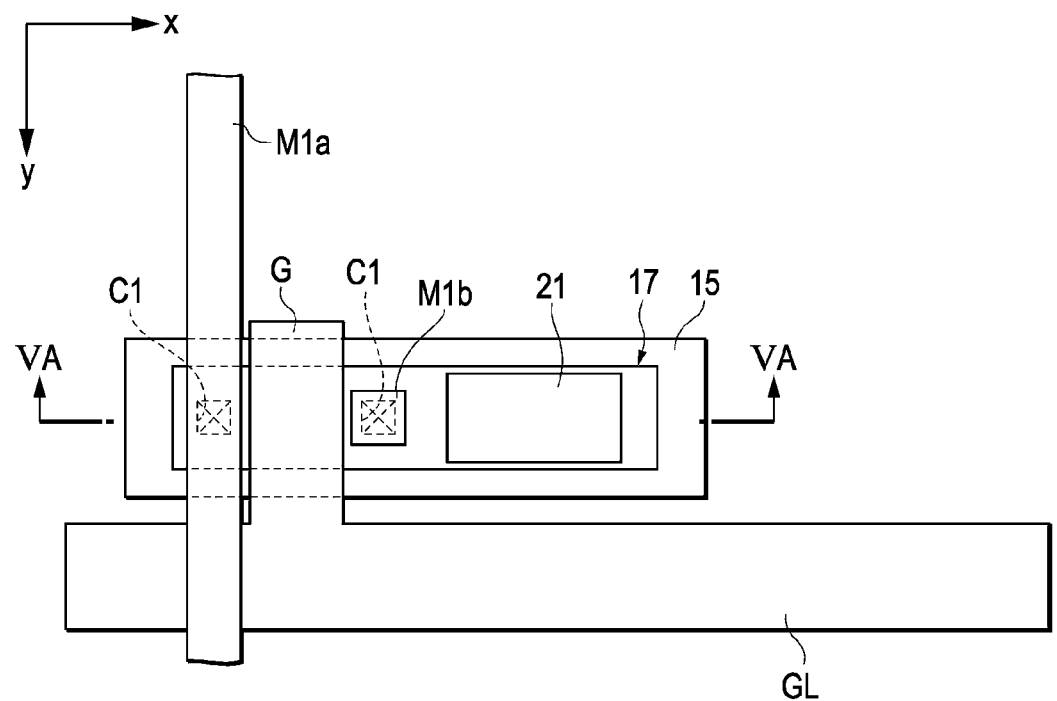
FIG. 5B is a corresponding plan view that schematically illustrates an example of a method for manufacturing an array substrate according to the first exemplary embodiment of the invention.

Next, a part of the inter-bedded insulation film 23 is etched away so as to form a contact hole C1 over the source region 17a and another contact hole C1 over the drain region 17a. Then, an electro-conductive film is deposited by means of a sputtering method over the surface of the inter-bedded insulation film 23. A part of the electro-conductive film is formed inside each of the contact holes C1. The electro-conductive film is made of aluminum, though not limited thereto. After the deposition thereof, the aluminum electro-conductive film is patterned so as to form each of first-layer wirings M1$a$ and M1$b$. As illustrated in FIG. 5B, the first-layer wiring M1$a$ is formed as a line that extends in the y direction. On the other hand, the first-layer wiring M1$b$ is connected to a pixel electrode PE as will be explained later.

Figure 6A:
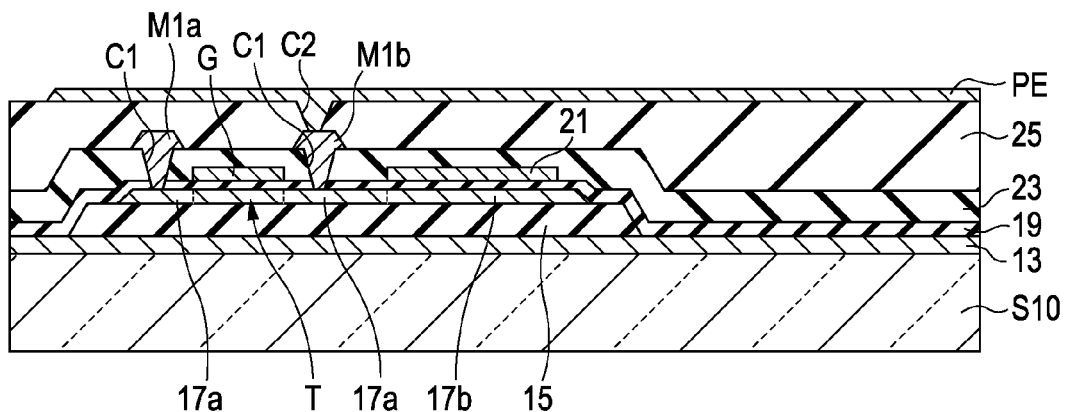
Figure 6B:
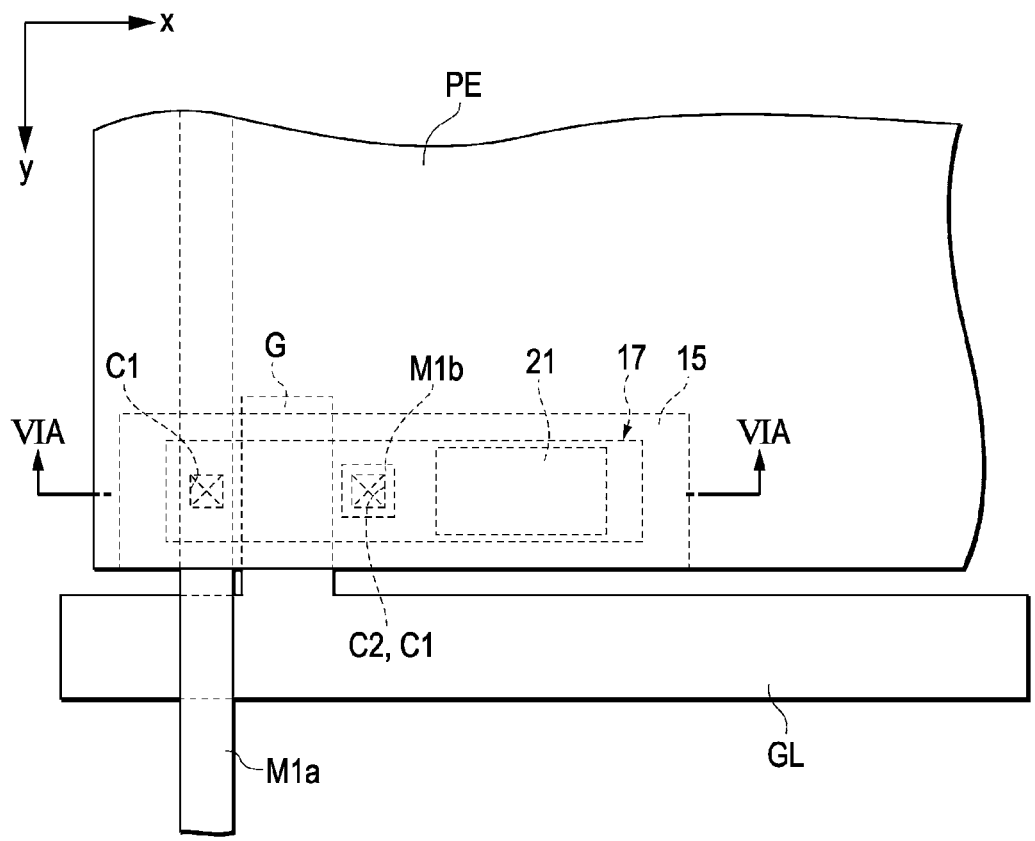
FIG. 6B is a corresponding plan view that schematically illustrates an example of a method for manufacturing an array substrate according to the first exemplary embodiment of the invention.

Next, as illustrated in FIG. 6A, another inter-bedded insulation film 25 is formed over the entire surface of the inter-bedded insulation film 23 so as to cover the first-layer wirings M1$a$ and M1$b$. The inter-bedded insulation film 25 is made of, for example, polyimide. For example, a polyimide resin solution is applied over the first substrate S10 by means of a spin coat method. Thereafter, the polyimide resin solution is solidified through heat treatment. Next, a part of the inter-bedded insulation film 25 is etched away so as to form a contact hole C2 over the first-layer wiring M1$b$. Thereafter, an electro-conductive film is deposited by means of a sputtering method on the surface of the inter-bedded insulation film 25. A part of the electro-conductive film is formed inside the contact hole C2. The electro-conductive film is made of, for example, indium tin oxide (ITO). After the deposition thereof, the electro-conductive film is patterned so as to form the pixel electrode PE. The formed lamination structure as viewed in plan is illustrated in FIG. 6B. The pixel electrodes PE are also arrayed in a matrix layout.

Through a series of array-substrate manufacturing steps explained above, the thin-film transistors T and the pixel electrodes PE are formed over the first substrate S10. Process of Transferring TFT and Pixel Electrode Next, the thin-film transistors T and the pixel electrodes PE that have been formed over the first substrate S10 are transferred from the first substrate S10 onto, finally, a third substrate S30, which is a flexible substrate. An example of such a transferring process is explained below.

As shown in FIG. 7, "one surface" of the first substrate S10 at which the pixel electrode PE has been formed is bonded to a second substrate S20 by means of an adhesive layer 27. The second substrate S20 is a temporary transfer target substrate to which the layer structure including the thin-film transistor T and the pixel electrode PE that has been formed over the first substrate S10 is temporarily bonded. An acrylate water-soluble adhesive or the like can be used as the adhesive layer 27. The material of the second substrate S20 is not specifically limited herein as long as it can perform its intended function in the course of transferring. For example, a glass substrate can be used as the second substrate S20.

Next, as shown in FIG. 8, the first substrate S10 is detached from, that is, removed from the aforementioned first-substrate removing layer 13. For example, a laser beam is irradiated onto the first-substrate removing layer 13, which is made of amorphous silicon. Such laser irradiation causes the entire first-substrate removing layer 13, or at least a part thereof, to be dissolved or gasified. In other words, a laser beam is irradiated thereon so that ablation should occur thereat. As a result thereof, either the inner layer of the first-substrate remover 13 or the surface layer thereof is cracked. By this means, it is possible to remove the first substrate S10 from the formed layer structure. Thereafter, any remaining part of the first-substrate removing layer 13 is washed away with the use of chemical fluid.

Next, as illustrated in FIG. 9, the first-substrate-removed surface of the laminated structure is bonded to the third substrate S30, which is a flexible substrate. A plastic substrate (i.e., resin substrate), a metal thin-film substrate, or the like can be used as the flexible substrate. An epoxy non-water-soluble adhesive or the like can be used as the adhesive layer 31.

Next, the second substrate S20 is removed from the adhesive layer 27. Thereafter, any remaining part of the adhesive layer 27 is washed away with the use of chemical fluid. In this way, the thin-film transistors T and the pixel electrodes PE that have been formed over the first substrate S10 are transferred from the first substrate S10 onto, through the temporary transfer thereof onto the second substrate S20, the flexible third substrate S30 as a final result of a series of transferring steps explained above.

Process of Manufacturing Electrophoresis Display Device

Figure 10:
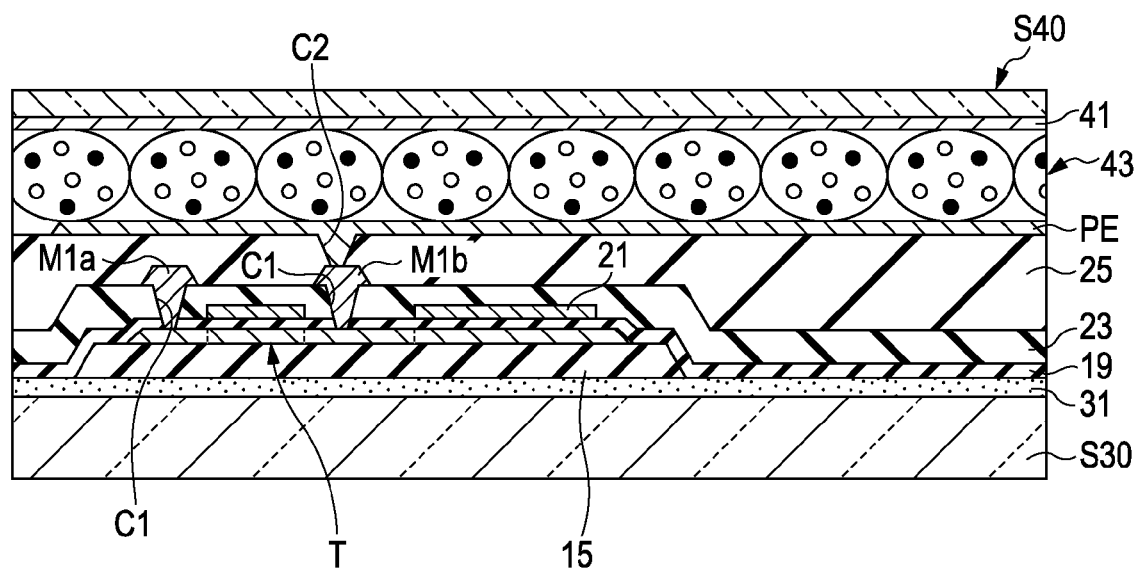
FIG. 10 is a sectional view that schematically illustrates an example of a method for manufacturing an electrophoresis display device according to the first exemplary embodiment of the invention.

FIG. 10 is a sectional view that schematically illustrates an example of a method for manufacturing an electrophoresis display device according to an exemplary embodiment of the invention. After the transferring process, as illustrated in FIG. 10, an electrophoresis sheet S40 over which a counter electrode 41 and an electrophoresis capsule layer 43 are formed is bonded, in a facedown position, to the pixel-electrode-exposed surface of the formed layer structure including the thin-film transistor T and the pixel electrode PE that has been transferred onto the third substrate S30. In this way, an electrophoresis display device according to an exemplary embodiment of the invention is manufactured.

As explained in detail above, in the configuration of a semiconductor device according to the present embodiment of the invention, the underlying insulation film 15 is formed over the third substrate S30 only at each area where, when viewed in plan, the semiconductor film 17 of each pixel is formed, if a small difference in the plan-view area size of the former and that of the latter is neglected herein. In other words, the underlying insulation film 15 is not formed at any area where, when viewed in plan, the semiconductor film 17 of each pixel is not formed.

With such a layout configuration, the underlying insulation film 15 makes it possible to prevent any contaminant from being dispersed onto the semiconductor film 17. In addition, it is possible to enhance the adhesion of the semiconductor film 17. Moreover, even when an electro-conductive substance is used as the material of the third substrate S30, it is possible to insulate the semiconductor film 17 from the substrate.

Furthermore, since the underlying insulation film 15 is formed only at partial areas, it is possible to provide a stress relief, that is, reduce stress applied to the underlying insulation film 15. In other words, stress is absorbed at separation areas at which the patterned underlying insulation films 15 are not formed, thereby making it possible to prevent or at least substantially reduce the occurrence of cracks.

Therefore, it is possible to prevent the thin-film transistor T or its constituent films from getting broken or cracked, which results in increased yield rate and improved transistor characteristics (i.e., reliability).

As explained above, since a part of the semiconductor film 17 is used as the first electrode 17$b$ of the aforementioned hold capacitor in the foregoing exemplary configuration of an embodiment of the invention, a part of the underlying insulation film 15 is formed at an area under the first electrode 17$b$ of the hold capacitor. If the hold capacitor is made up of the gate insulation film 19, the second electrode 21, and any other wiring layer in place of the first electrode 17$b$, it suffices to form the underlying insulation film 15 at an area under other parts of the semiconductor film 17 that make up the thin-film transistor T, or more specifically, at the source region 17$a$, the channel region 17$c$, and the drain region 17$a$ only.

Although a transferring method is used in a manufacturing method according to the present embodiment of the invention, the scope of the present invention is not limited thereto.

The thin-film transistors T and the pixel electrodes PE may be formed directly over the third substrate S30 without using a transferring technique. A layer structure that is formed by means of such a direct formation method is the same as that shown in FIG. 9 except that the adhesive layer 31 is not provided in the layer structure formed by means of the direct formation method. The same "process of manufacturing an array substrate" as that explained above can be implemented directly on the surface of the third substrate S30 without using the first-substrate removing layer 13.

Embodiment 2

In the foregoing description of the first embodiment of the invention, it is explained that a top-gate TFT is used as an example of a thin-film transistor of each pixel. However, the scope of the invention is not limited to such an exemplary configuration. For example, a thin-film transistor of each pixel may be configured as a bottom-gate TFT in place of a top-gate TFT. It should be noted that, in the following description of the second embodiment of the invention, the same reference numerals are consistently used for the same components as those of a semiconductor device according to the first embodiment of the invention explained above so as to omit any redundant explanation or simplify explanation thereof.

Configuration of Array Substrate

Figure 11:
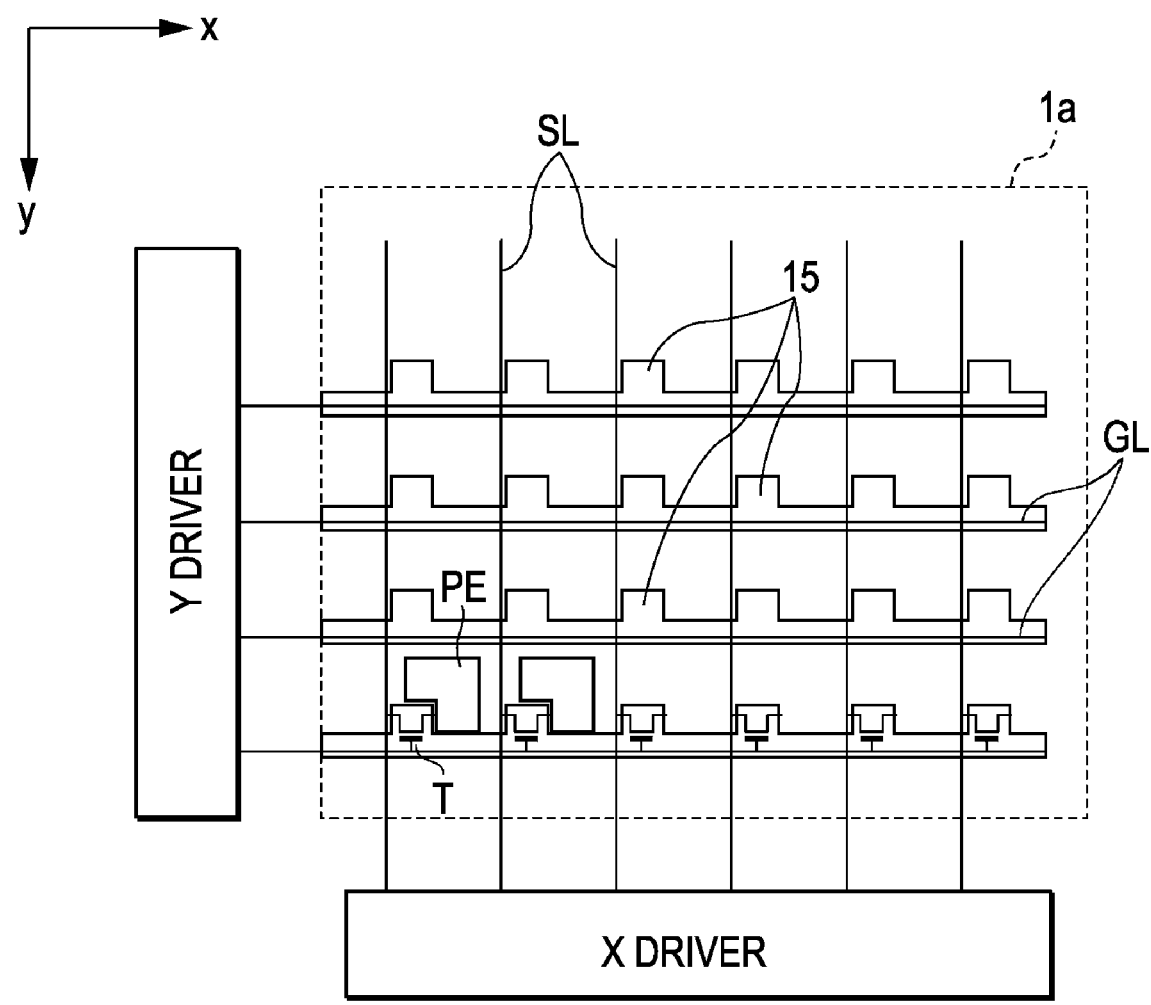
FIG. 11 is a circuit diagram that schematically illustrates an example of the configuration of an array substrate according to a second exemplary embodiment of the invention.

FIG. 11 is a circuit diagram that schematically illustrates an example of the configuration of an array substrate according to an exemplary embodiment of the invention. As illustrated in the drawing, in the configuration of an array substrate according to the present embodiment of the invention, the underlying insulation film 15 is formed over the substrate only at an area under each patterned semiconductor film, which makes up a part of a thin film transistor T, and under each gate line GL that extends in the x direction. That is, as shown therein, the underlying insulation film 15 is formed at x-connected island areas that are separated from one another when viewed in the y direction in plan. In the preceding sentence, the term "x-connected island areas" means x-directional line areas, each of which is elongated in the x direction.

Process of Manufacturing Array Substrate

Figure 12A:
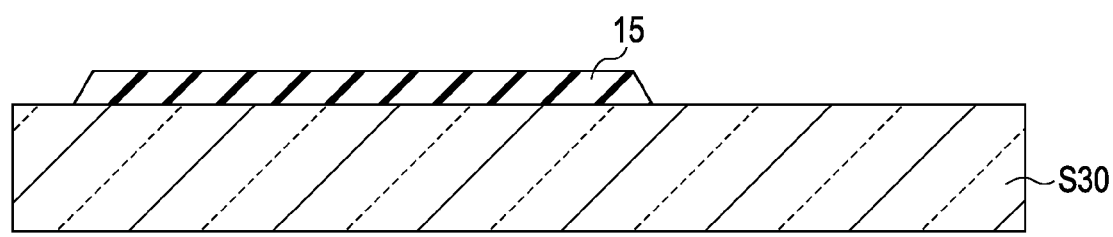
Figure 14:
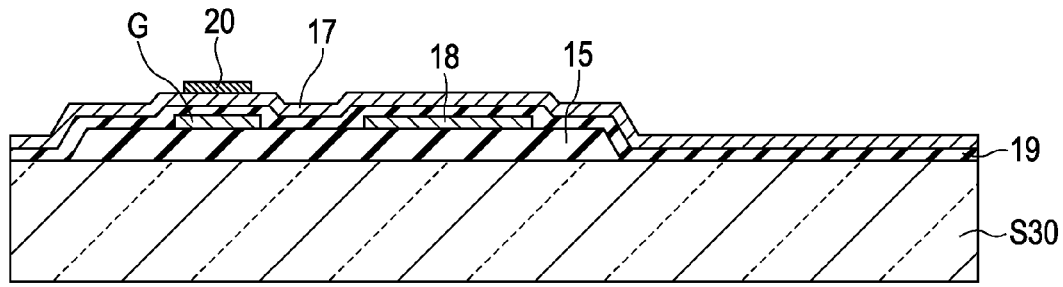
FIG. 14 is a sectional view that schematically illustrates an example of a method for manufacturing an array substrate according to the second exemplary embodiment of the invention.

Each of FIGS. 12A/12B, 13A/13B, 15A/15B, 16A/16B, and 17A/17B is a set of a sectional view and a plan view corresponding to each other that schematically illustrates an example of a method for manufacturing an array substrate according to the present embodiment of the invention. FIG. 14 is a sectional view that schematically illustrates an example of a method for manufacturing an array substrate according to the present embodiment of the invention. In the following description, a method for manufacturing an array substrate according to the present embodiment of the invention is explained while referring to these drawings, including the formation of thin-film transistors and pixel electrodes. In addition to its manufacturing method, the configuration of an array substrate (especially, thin-film transistor) according to the present embodiment of the invention is also explained below.

As illustrated in FIG. 12A, a silicon oxide film, without any limitation thereto, is deposited as the underlying insulation film 15 on the entire surface of the third substrate S30, which is a flexible substrate, by means of a CVD method or the like. The thickness of the underlying insulation film 15 that is made of silicon oxide is approximately 300-500 nm. Other inorganic insulation film such as a silicon nitride film or the like may be used in place of the silicon oxide film.

Figure 12B:
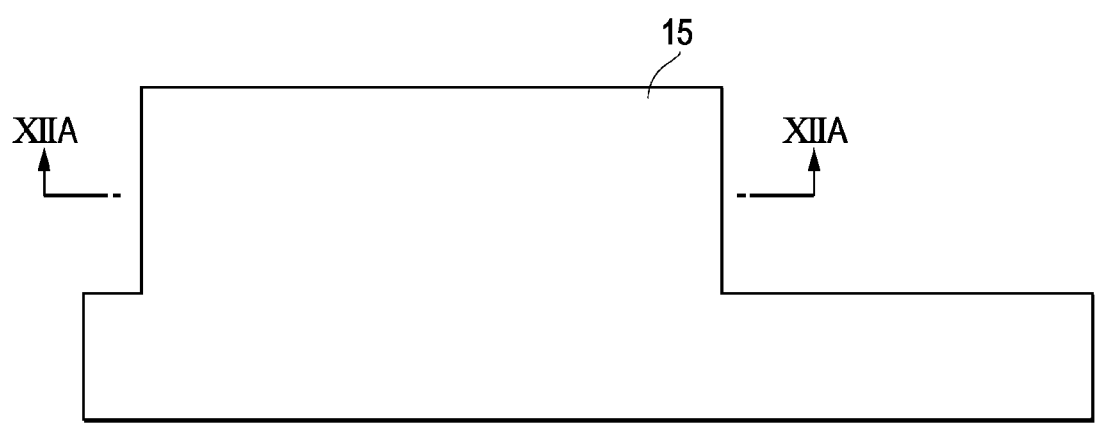
FIG. 12B is a corresponding plan view that schematically illustrates an example of a method for manufacturing an array substrate according to the second exemplary embodiment of the invention.

Next, as illustrated in FIG. 12B, the underlying insulation film 15 is patterned into an x-elongated shape. That is, the patterned underlying insulation film 15 extends in the x direction. The patterned shape of underlying insulation film 15 corresponds to the patterned shapes of the semiconductor film 17 and the gate electrode G of each pixel as well as the formed shape of each gate line GL that extends in the x direction so as to provide a gate electric connection to the gate electrode G of the TFT of each one of a row of pixels aligned in the x direction as will be summarized later.

Figure 13A:
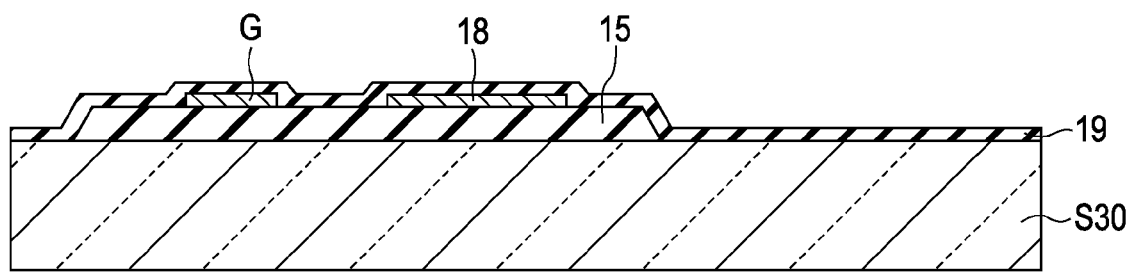
Figure 13B:
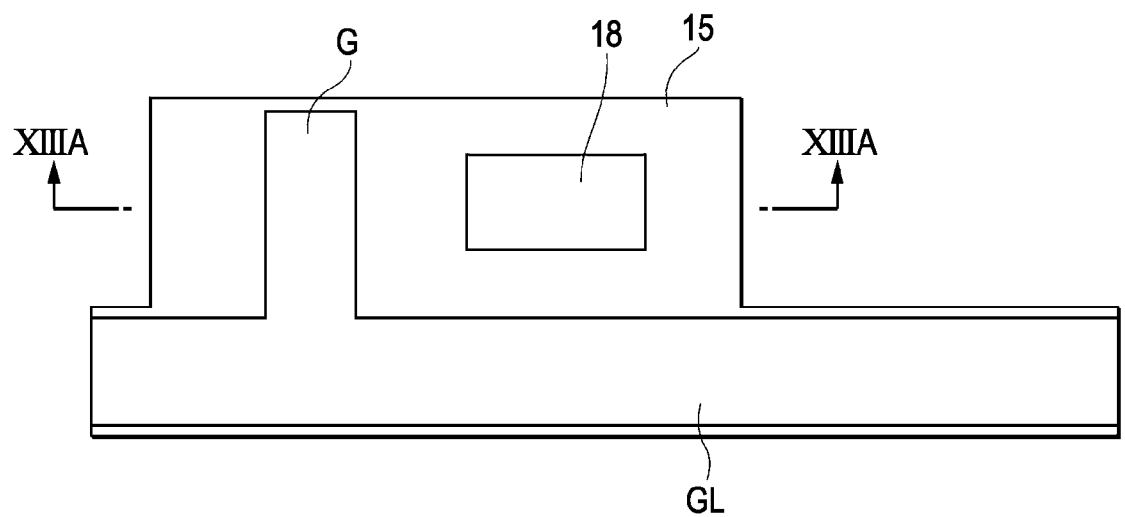
FIG. 13B is a corresponding plan view that schematically illustrates an example of a method for manufacturing an array substrate according to the second exemplary embodiment of the invention.

Thereafter, as illustrated in FIGS. 13A and 13B, a metal film such as an aluminum (Al) film or the like is deposited on the underlying insulation film 15 as an electro-conductive film by means of a sputtering method, which is followed by the patterning thereof. The gate electrode G is formed as a result of the deposition of the electro-conductive film on the underlying insulation film 15 and the patterning thereof. During the process of the formation of the gate electrode G explained above, a first electrode 18 of a hold capacitor as well as the gate electrode GL is also formed as shown in FIG. 13B.

Next, a silicon oxide film, without any limitation thereto, is deposited over the third substrate S30 by means of a CVD method or the like. The silicon oxide film functions as the gate insulation film 19. The thickness of the gate insulation film 19 is approximately 75 nm.

Next, for example, a non-impurity-doped amorphous silicon film, which means an amorphous silicon film without any implantation of impurities therein, is deposited over the entire surface of the gate insulation film 19 by means of a CVD method. The formed non-impurity-doped amorphous silicon film functions as the semiconductor film 17. Then an etching stopper film 20 is formed on the channel region of the semiconductor film 17. In other words, the etching stopper film 20 is formed over the gate electrode G.

Figure 15A:
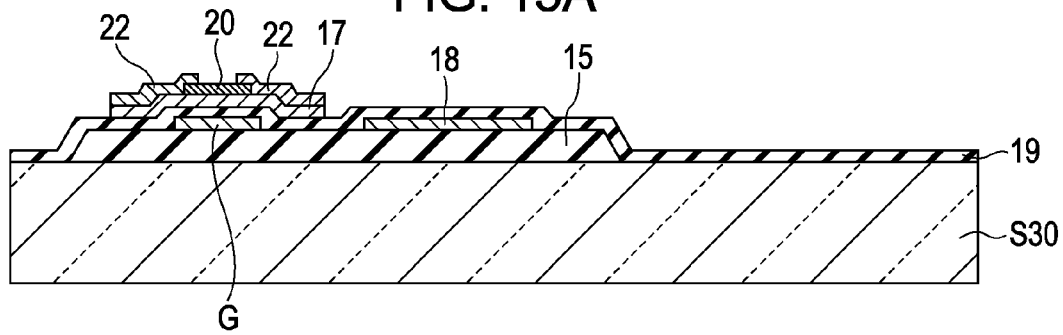
Figure 15B:
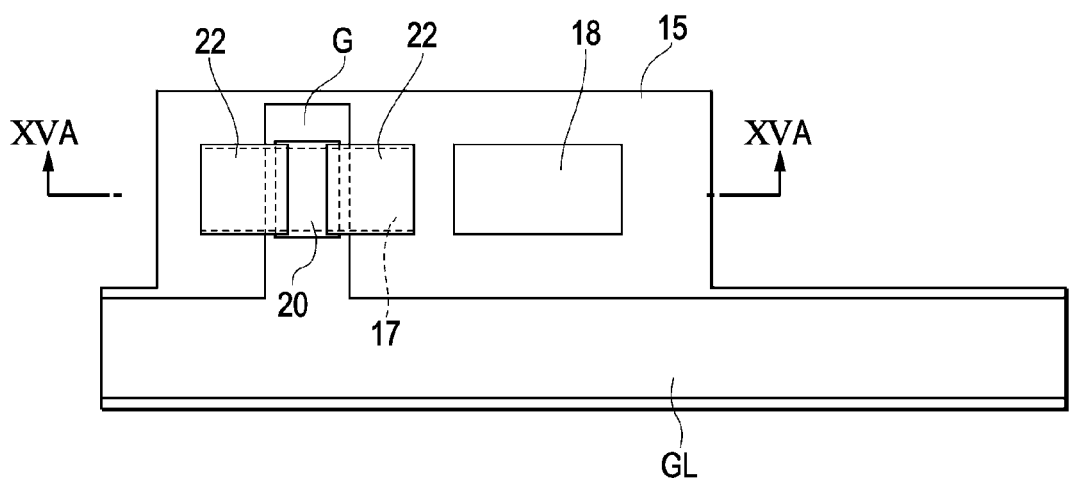
FIG. 15B is a corresponding plan view that schematically illustrates an example of a method for manufacturing an array substrate according to the second exemplary embodiment of the invention.

Next, as illustrated in FIG. 15A, an impurity-doped semiconductor film 22 is deposited on the surface of the semiconductor film 17 by means of a CVD method. At an area where the etching stopper film 20 is formed, the impurity-doped semiconductor film 22 is deposited on the etching stopper film 20 over the semiconductor film 17. Then, the formed film structure made up of the semiconductor film 17 and the impurity-doped semiconductor film 22 is etched into a substantially rectangular pattern. In addition, a channel-region part of the impurity-doped semiconductor film 22, which lies at the channel region when viewed in plan, is etched away so as to expose a part of the etching stopper film 20 thereat. As a result of the etching treatment explained above, the etching stopper film 20 remains without being etched away substantially at the center of the substantially rectangular semiconductor film 17. In addition, a non-channel-region part of the rectangular-patterned impurity-doped semiconductor film 22 remains without being etched away at areas next to the exposed area. That is, as shown in FIGS. 15A and 15B, these films are formed in such a manner that a part of the impurity-doped semiconductor film 22 overlies a part of the etching stopper film 20 with a partial overlap therebetween when viewed in plan. The remaining part of the impurity-doped semiconductor film 22 functions as a source electrode and a drain electrode.

Figure 16A:
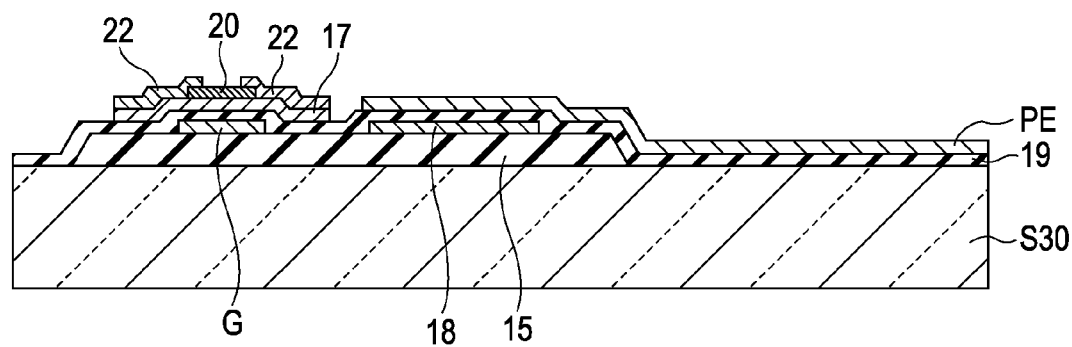
Figure 16B:
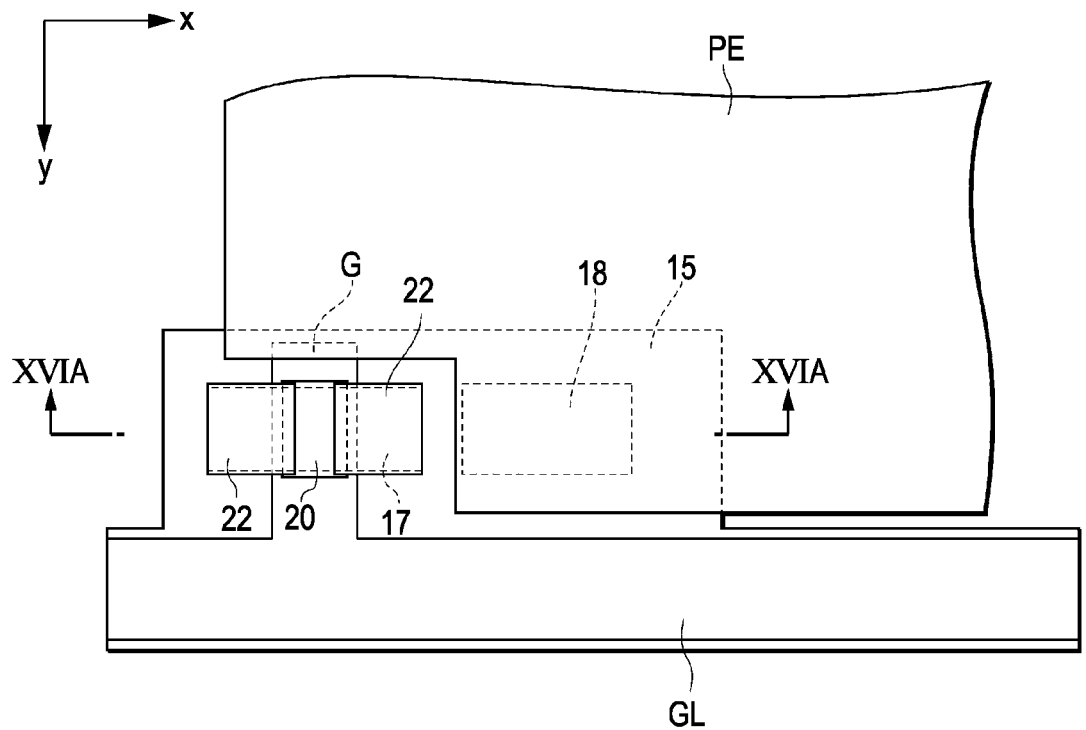
FIG. 16B is a corresponding plan view that schematically illustrates an example of a method for manufacturing an array substrate according to the second exemplary embodiment of the invention.

Thereafter, as illustrated in FIGS. 16A and 16B, an indium tin oxide (ITO) film or the like is deposited on the gate insulation film 19 over the third substrate S30 as an electro-conductive film by means of a sputtering method, which is followed by the patterning thereof. The pixel electrode PE is formed as a result of the deposition of the electro-conductive ITO film on the gate insulation film 19 over the third substrate S30 and the patterning thereof.

Figure 17A:
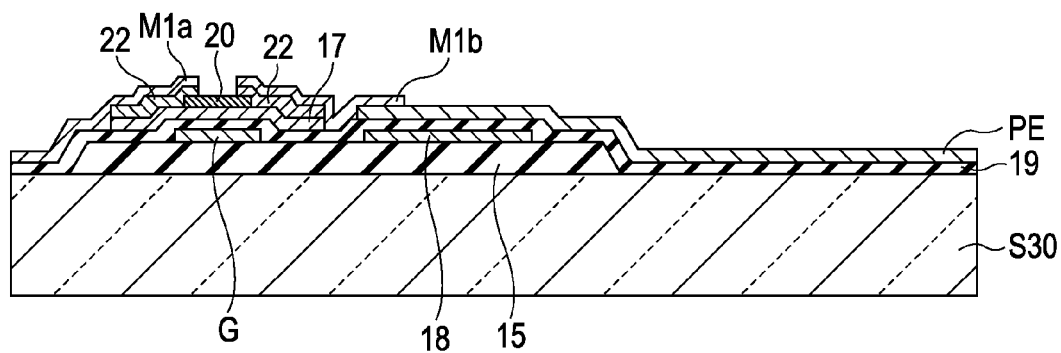
Figure 17B:
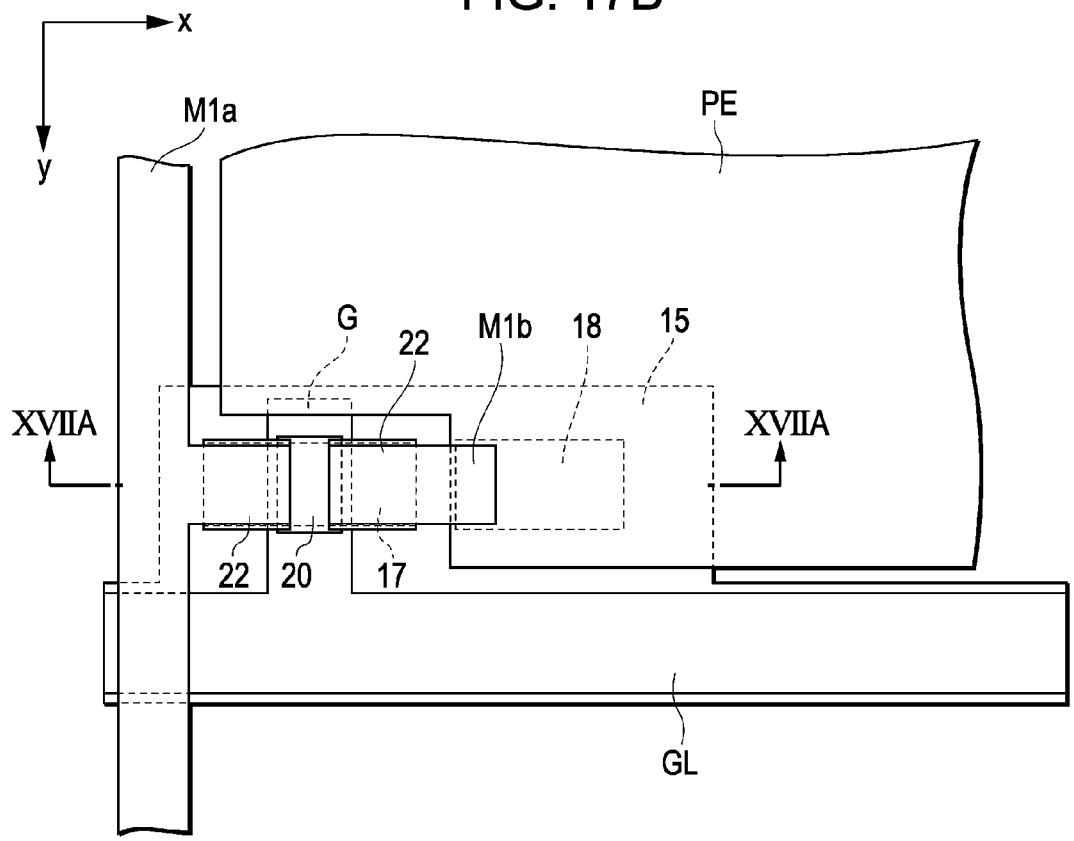
FIG. 17B is a corresponding plan view that schematically illustrates an example of a method for manufacturing an array substrate according to the second exemplary embodiment of the invention.

As the next step, an electro-conductive film such as an Al film or the like is deposited over the third substrate S30 by means of a sputtering method, which is followed by the patterning thereof, so as to form the first-layer wirings M1a and M1b as illustrated in FIG. 17A. The first-layer wiring M1a is formed substantially as a line having a non-line portion. The line portion of the first-layer wiring M1a extends in the y direction. The non-line portion of the first-layer wiring M1a overlies the source-electrode (drain-electrode) portion of the impurity-doped semiconductor film 22. On the other hand, a part of the first-layer wiring M1b overlies the drain-electrode (source-electrode) portion of the impurity-doped semiconductor film 22. The first-layer wiring M1b extends therefrom onto the pixel electrode PE. An example of the two-dimensional layout thereof is illustrated in FIG. 17B.

Through a series of array-substrate manufacturing steps explained above, the thin-film transistors T and the pixel electrodes PE are formed over the third substrate S30.

Process of Manufacturing Electrophoresis Display Device

After the formation of the array-substrate layer structure through a series of manufacturing steps described above, as done in the electrophoresis-display-device manufacturing process according to the first exemplary embodiment of the invention described above, the electrophoresis sheet S40 over which the counter electrode 41 and the electrophoresis capsule layer 43 are formed is bonded, in a facedown position, to the pixel-electrode-exposed surface of the formed layer structure including the thin-film transistor T and the pixel electrode PE that has been formed over the third substrate S30. In this way, an electrophoresis display device according to an exemplary embodiment of the invention is manufactured (refer to FIG. 10).

As explained in detail above, in the configuration of a semiconductor device according to the present embodiment of the invention, the underlying insulation film 15 is formed over the third substrate S30 only at an area under the semiconductor film 17 of each pixel and the gate electrode G thereof as well as under each gate line GL that extends in the x direction. In other words, the underlying insulation film 15 is formed at x-directional line areas that are separated from one another when viewed in the y direction in plan and extend in the x direction so that the patterned shape of underlying insulation film 15 corresponds to the patterned shapes of the semiconductor film 17 and the gate electrode G of each pixel as well as the formed shape of each gate line GL that extends in the x direction.

With such a layout configuration, the underlying insulation film 15 makes it possible to prevent any contaminant from being dispersed not only onto the semiconductor film 17 but also onto the gate line GL inclusive of the gate electrode G. In addition, it is possible to enhance the adhesion of the semiconductor film 17 and the gate line GL inclusive of the gate electrode G. Moreover, even when an electro-conductive substance is used as the material of the third substrate S30, it is possible to insulate the semiconductor film 17 from the substrate and further insulate the gate line GL inclusive of the gate electrode G therefrom.

Furthermore, since the underlying insulation film 15 is formed only at the above-mentioned x-directionally elongated areas that are separated from one another when viewed in the y direction in plan, it is possible to provide a stress relief, that is, reduce stress applied to the underlying insulation film 15. Especially, such a layout configuration offers y-directional stress reduction. Thus, it is possible to prevent or at least substantially reduce the occurrence of cracks.

Therefore, it is possible to prevent the thin-film transistor T or its constituent films from getting broken or cracked, which results in increased yield rate and improved transistor characteristics (i.e., reliability).

In the configuration of a semiconductor device according to the present embodiment of the invention, the aforementioned hold capacitor is made up of the first electrode 18 and a part of the pixel electrode PE that is deposited over the first electrode 18 with the gate insulation film 19 being interposed therebetween. In the foregoing description of a semiconductor device according to the second embodiment of the invention, as shown in FIG. 12B, it is explained that the underlying insulation film 15 is formed at x-directional line areas each of which has a plurality of patterned y-projections each having a width that is greater than that of the line area portion thereof. Each greater-width area portion corresponds to the patterned semiconductor film 17. However, the scope of the invention is not limited to such a specific layout example. As a non-limiting modification example thereof, the width of the non-projected area portion (i.e., line area portion) of each x-directional line area of the foregoing exemplary configuration may be increased so that there is no difference in width therebetween. That is, the underlying insulation film 15 may be patterned so as to form a plurality of x-directional line areas each having no projection because of a uniform line width. In the foregoing description of a semiconductor device according to the second embodiment of the invention, it is explained that the thin-film transistors T and the pixel electrodes PE are formed directly over the third substrate S30, which is a flexible substrate. However, the scope of the invention is not limited to such a specific manufacturing process example. That is, a transferring technique may be used as explained in the first embodiment of the invention. Specifically, the thin-film transistors T and the pixel electrodes PE that have been formed over the first substrate S10 may be transferred from the first substrate S10 onto, through the temporary transfer thereof onto the second substrate S20, the flexible third substrate S30 as a final result of a series of transferring steps. Furthermore, in the bottom-gate TFT configuration of the second embodiment of the invention, in a case where the third substrate S30 having insulation property is used, the underlying insulation film 15 may be formed in a separated manner at each area under the semiconductor film 17 only as in the layout configuration of the first embodiment of the invention.

Still furthermore, in the top-gate TFT configuration of the first embodiment of the invention, the underlying insulation film 15 may be formed in a separated manner at an area under the semiconductor film 17 of each pixel and the gate electrode G thereof as well as under each gate line GL that extends in the x direction as in the layout configuration of the second embodiment of the invention. If so modified, the underlying insulation film 15 and the gate insulation film 19 are formed under each gate line GL, which makes it possible to prevent the dispersion of contaminant thereon with reinforced protection.

As explained above, various modifications of the separated array of the underlying insulation film 15 can be made without departing from the scope and spirit of the invention. To sum up, the underlying insulation film 15 is patterned into separate areas each of which includes, when viewed in plan, at least one of a plurality of patterned areas of the semiconductor film 17. With such a separate layout of the underlying insulation film 15, it is possible to make stress applied to the underlying insulation film 15 smaller in comparison with a case where the underlying insulation film 15 is formed over the entire surface of the flexible third substrate S30 either directly or indirectly without any separation thereof. The specific areas at which the underlying insulation film 15 is formed can be arbitrarily determined depending on specific uses while taking the function of the underlying insulation film 15 in a transistor structure as well as the transistor structure itself in the intended use into consideration.

Electronic Apparatus

An electrophoresis display device explained in the foregoing first and second embodiments of the invention can be built in various kinds of electronic apparatuses.

Electronic Paper

Figure 18:
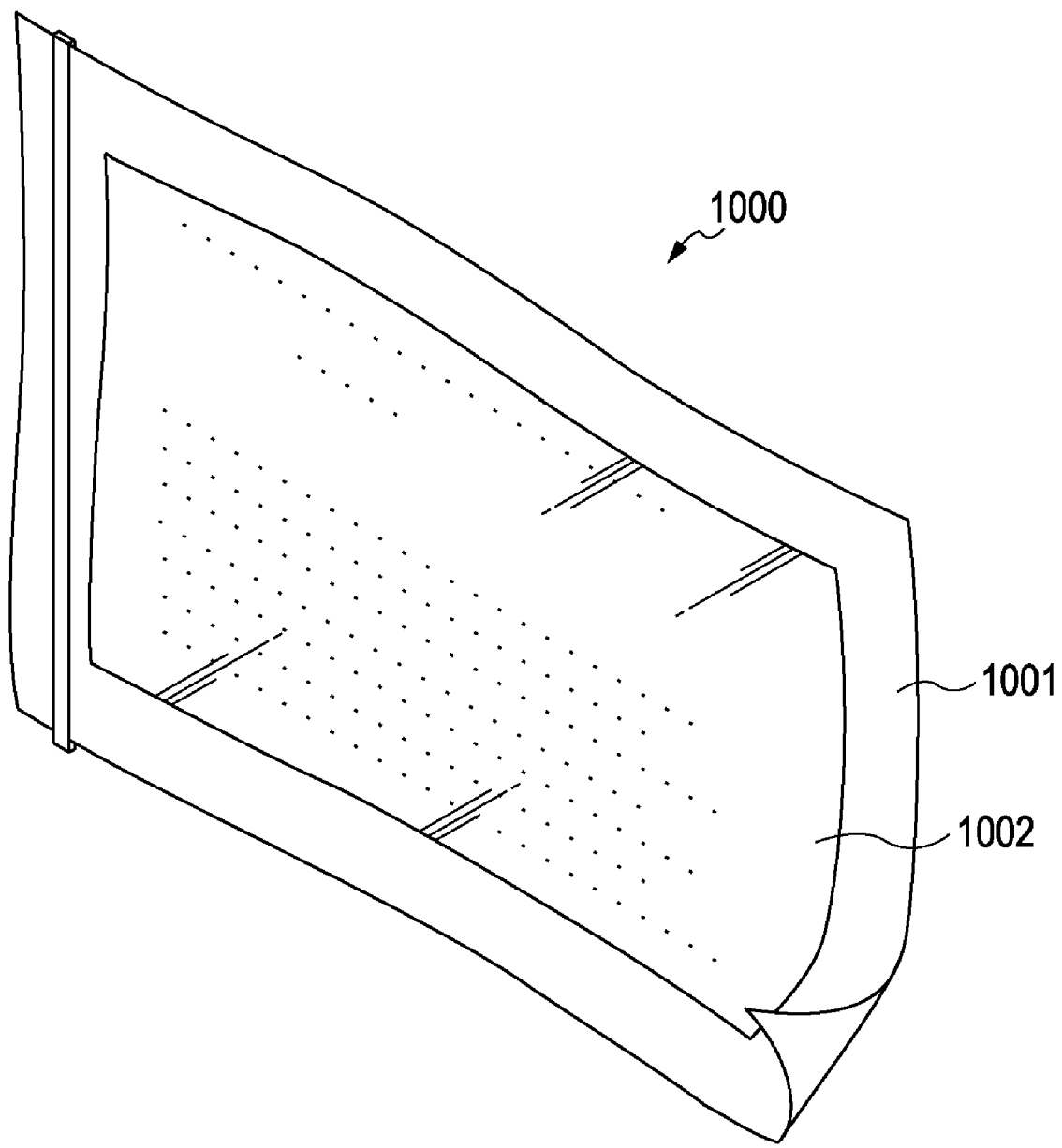
FIG. 18 is a perspective view that schematically illustrates an example of the configuration of a sheet of electronic paper, which is an example of a variety of electronic apparatuses.

For example, the electrophoresis display device explained above can be applied to electronic paper. FIG. 18 is a perspective view that schematically illustrates an example of the configuration of a sheet of electronic paper, which is an example of a variety of electronic apparatuses.

Electronic paper 1000 shown in FIG. 18 is made up of a main body unit 1001 and a display unit 1002. The main body unit 1001 of the electronic paper 1000 is made of a sheet material that has almost the same texture and flexibility as those of conventional paper (i.e., normal non-electronic paper). The main body unit 1001 of the electronic paper 1000 is configured as an electrically rewritable sheet. The display unit 1002 of the electronic paper 1000 is configured as the electrophoresis display device explained above.

In the foregoing description of exemplary embodiments of the invention, an electrophoresis display device is taken as an example of various kinds of electro-optical devices and other display devices. However, the scope of the invention is not limited to such a specific application example. For example, the concept of the invention can be applied to, without any limitation thereto, a variety of electro-optical devices and other display devices including a liquid crystal device and an organic electroluminescent (EL) device.

Other Electronic Apparatuses

Some examples of a variety of electronic apparatuses having various kinds of electro-optical devices explained above are shown in FIGS. 19 and 20.

Figure 19:
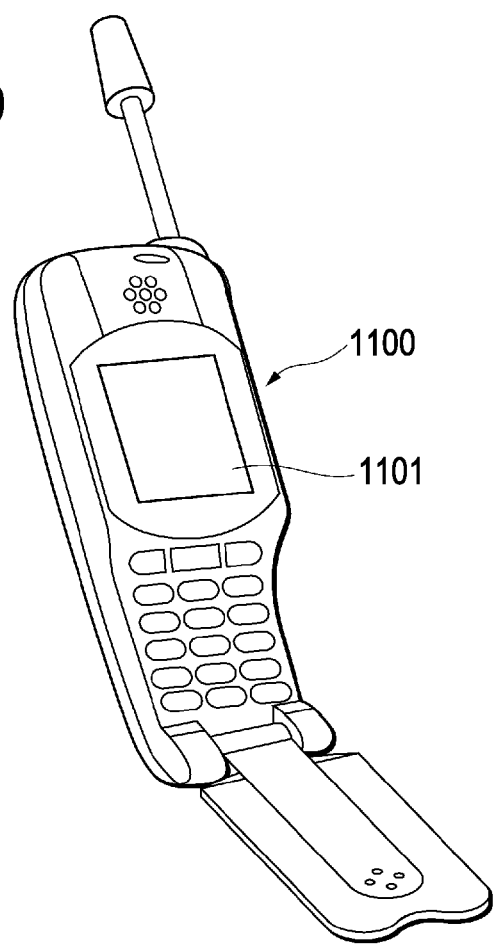
FIG. 19 is a perspective view that schematically illustrates an example of the configuration of a mobile phone, which is a non-limiting example of various kinds of electronic apparatuses.

FIG. 19 is a perspective view that schematically illustrates an example of the configuration of a mobile phone, which is a non-limiting example of various kinds of electronic apparatuses. The mobile phone 1100 is provided with a display unit 1101. The electro-optical device explained above can be built in the display unit 1101 of the mobile phone 1100.

Figure 20:
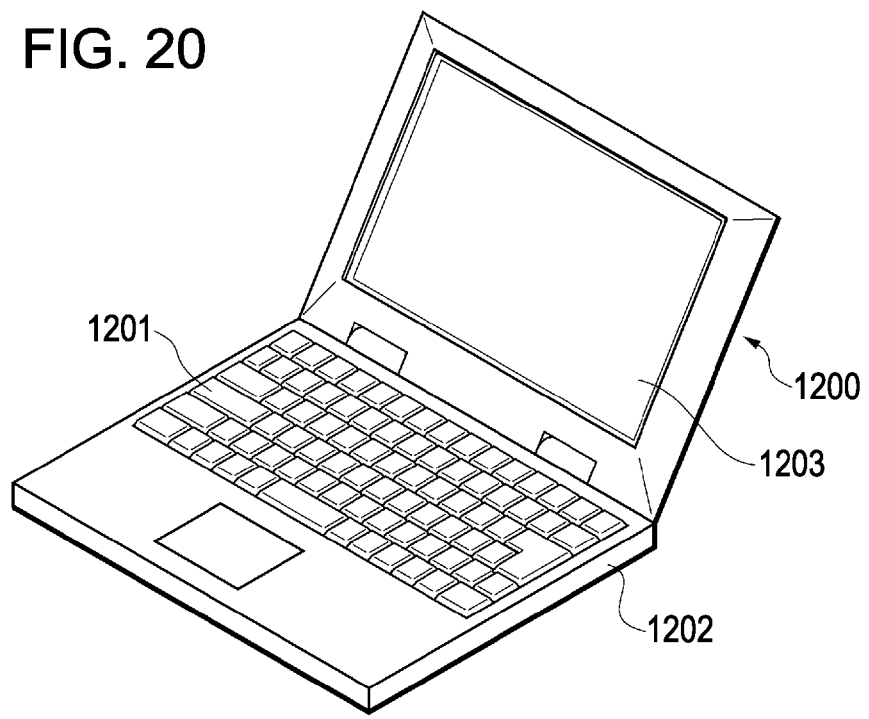
FIG. 20 is a perspective view that schematically illustrates an example of the configuration of a portable information-processing device, which is another example of various kinds of electronic apparatuses.

FIG. 20 is a perspective view that schematically illustrates an example of the configuration of a portable information-processing device, which is another example of various kinds of electronic apparatuses. A portable information-processing device 1200 is provided with an input unit 1201 such as a keyboard and the like, a main body unit 1202 in which a computation unit, a memory unit, and the like are housed, and a display unit 1203. The electro-optical device explained above can be built in the display unit 1203 of the portable information-processing device 1200.

Besides the mobile phone 1100 and the portable information-processing device 1200 described above, the invention can be embodied in a wide variety of applications, including an electronic apparatus having, without any limitation thereto, a television, a viewfinder-type video recorder or a direct-monitor-view-type video recorder, a car navigation device, a pager, an electronic personal organizer, an electronic calculator, electronic newspaper, a word processor, a personal computer, a workstation, a videophone, a POS terminal, or a touch-panel device. The electro-optical device explained above can be built in the display unit of various kinds of electronic apparatuses enumerated above without any limitation thereto.

Note that specific examples and application examples explained in the foregoing exemplary embodiments of the invention may be combined as each other or one another and/or modified, changed, adapted, altered, or improved so as to make them suitable for their particular use. Although various exemplary embodiments of the present invention are described above, needless to say, the invention is in no case restricted to these exemplary embodiments described herein.

For example, each material that appears in the foregoing description of exemplary embodiments of the invention is mentioned merely for the purpose of explanation only without any explicit or implicit intention to limit the scope of the invention. Thus, any of the above-mentioned materials may be modified in the actual implementation thereof. In addition, the patterned shape of each film, layer, member, component, part, element, unit, or the like that appears in the foregoing description of exemplary embodiments of the invention is also mentioned merely for the purpose of explanation only without any explicit or implicit intention to limit the scope of the invention. The patterned shape thereof may be modified as long as such modification does not constitute any departure from the scope and spirit of the invention.

The entire disclosure of Japanese Patent Application No. 2008-028864, filed Feb. 8, 2008 is expressly incorporated by reference herein.

What is claimed is:

1. A semiconductor device comprising:
   a substrate;
   an underlying insulation film that is formed over the substrate, the underlying insulation film being patterned into a plurality of island areas over the substrate; and
   a plurality of thin-film transistors, each thin-film transistor being formed over a respective underlying insulation film, each of the plurality of thin-film transistors having a semiconductor film.

2. The semiconductor device according to claim 1, wherein each of the plurality of thin-film transistors has the semiconductor film that is formed over the underlying insulation film and further has a gate electrode that is formed over the semiconductor film with a gate insulation film being formed at a layer between the gate electrode and the semiconductor film; and the underlying insulation film is formed in separate areas each of which includes, when viewed in plan, at least one of the plurality of semiconductor films.

3. The semiconductor device according to claim 2, wherein the underlying insulation film is formed in separate areas corresponding to, when viewed in plan, the semiconductor films only.

4. The semiconductor device according to claim 2, further comprising a plurality of gate lines that is formed at the same layer as the layer of the gate electrodes, each gate line connecting the gate electrodes arrayed adjacent to one another either in a first direction or a second direction, the second direction being orthogonal to the first direction, wherein the underlying insulation film is formed in separate areas as viewed in the first direction or the second direction, the separate areas corresponding to, when viewed in plan, the semiconductor films, the gate electrodes, and the gate lines only.

5. The semiconductor device according to claim 1, wherein each of the plurality of thin-film transistors has a gate electrode that is formed over the underlying insulation film and further has the semiconductor film that is formed over the gate electrode with a gate insulation film being formed at a layer between the semiconductor film and the gate electrode; and the underlying insulation film is formed in separate areas each of which includes, when viewed in plan, at least one of the plurality of semiconductor films and at least one of the plurality of gate electrodes.

6. The semiconductor device according to claim 5, further comprising electro-conductive films that are formed at the same layer as the layer of the gate electrodes, wherein the underlying insulation film is formed in separate areas corresponding to, when viewed in plan, the gate electrodes, the semiconductor films, and the electro-conductive films only.

7. The semiconductor device according to claim 5, further comprising a plurality of gate lines that is formed at the same layer as the layer of the gate electrodes, each gate line connecting the gate electrodes arrayed adjacent to one another either in a first direction or a second direction, the second direction being orthogonal to the first direction, wherein the underlying insulation film is formed in separate areas as viewed in the first direction or the second direction, the separate areas corresponding to, when viewed in plan, the semiconductor films, the gate electrodes, and the gate lines only.

8. The semiconductor device according to claim 1, wherein the substrate is a flexible substrate.

9. An electro-optical device that is provided with the semiconductor device according to claim 1.

10. An electronic apparatus that is provided with the electro-optical device according to claim 9.

11. An electronic apparatus that is provided with semiconductor device according to claim 1.

12. A semiconductor device comprising:
   a substrate;
   an underlying insulation film that is formed over the substrate; and
   a plurality of thin-film transistors that is formed over the underlying insulation film, each of the plurality of thin-film transistors having a semiconductor film,
   wherein the underlying insulation film is formed in separate areas each of which includes, when viewed in plan, at least one of the plurality of semiconductor films;
   each of the plurality of thin-film transistors has the semiconductor film that is formed over the underlying insulation film and further has a gate electrode that is formed over the semiconductor film with a gate insulation film being formed at a layer between the gate electrode and the semiconductor film; and the underlying insulation film is formed in separate areas each of which includes, when viewed in plan, at least one of the plurality of semiconductor films; and
   a plurality of gate lines are formed at the same layer as the layer of the gate electrodes, each gate line connecting the gate electrodes arrayed adjacent to one another either in a first direction or a second direction, the second direction being orthogonal to the first direction, wherein the underlying insulation film is formed in separate areas as viewed in the first direction or the second direction, the separate areas corresponding to, when viewed in plan, the semiconductor films, the gate electrodes, and the gate lines only.

13. The semiconductor device according to claim 12, wherein the underlying insulation film is formed in separate areas corresponding to, when viewed in plan, the semiconductor films only.

14. The semiconductor device according to claim 12, wherein the substrate is a flexible substrate.

15. An electro-optical device that is provided with the semiconductor device according to claim 12.

16. An electronic apparatus that is provided with the semiconductor device according to claim 12.

17. A semiconductor device comprising:
   a substrate;
   an underlying insulation film that is formed over the substrate; and
   a plurality of thin-film transistors that is formed over the underlying insulation film, each of the plurality of thin-film transistors having a semiconductor film,
   wherein the underlying insulation film is formed in separate areas each of which includes, when viewed in plan, at least one of the plurality of semiconductor films;
   each of the plurality of thin-film transistors has a gate electrode that is formed over the underlying insulation film and further has the semiconductor film that is formed over the gate electrode with a gate insulation film being formed at a layer between the semiconductor film and the gate electrode; and the underlying insulation film is formed in separate areas each of which includes, when viewed in plan, at least one of the plurality of semiconductor films and at least one of the plurality of gate electrodes; and
   a plurality of gate lines are formed at the same layer as the layer of the gate electrodes, each gate line connecting the gate electrodes arrayed adjacent to one another either in a first direction or a second direction, the second direction being orthogonal to the first direction, wherein the underlying insulation film is formed in separate areas as viewed in the first direction or the second direction, the separate areas corresponding to, when viewed in plan, the semiconductor films, the gate electrodes, and the gate lines only.

18. The semiconductor device according to claim 17, further comprising electro-conductive films that are formed at the same layer as the layer of the gate electrodes, wherein the underlying insulation film is formed in separate areas corresponding to, when viewed in plan, the gate electrodes, the semiconductor films, and the electro-conductive films only.

19. The semiconductor device according to claim 17, wherein the substrate is a flexible substrate.

20. An electro-optical device that is provided with the semiconductor device according to claim 17.

21. An electronic apparatus that is provided with the semiconductor device according to claim 17.

* * * * *